(12) United States Patent
Kwon et al.

(10) Patent No.: US 10,676,666 B2
(45) Date of Patent: Jun. 9, 2020

(54) QUANTUM DOT AGGREGATE PARTICLES, PRODUCTION METHODS THEREOF, AND COMPOSITIONS AND ELECTRONIC DEVICES INCLUDING THE SAME

(71) Applicants: SAMSUNG ELECTRONICS CO., LTD., Suwon-si, Gyeonggi-do (KR); Samsung Display Co., Ltd., Yongin-si, Gyeonggi-do (KR); SAMSUNG SDI CO., LTD., Yongin-si, Gyeonggi-do (KR)

(72) Inventors: Ha Il Kwon, Suwon-si (KR); Tae Gon Kim, Hwaseong-si (KR); Jooyeon Ahn, Suwon-si (KR); Nayoun Won, Suwon-si (KR); Shin Ae Jun, Seongnam-si (KR); Eun Joo Jang, Suwon-si (KR)

(73) Assignees: SAMSUNG ELECTRONICS CO., LTD., Gyeonggi-Do (KR); SAMSUNG DISPLAY CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 352 days.

(21) Appl. No.: 15/675,251

(22) Filed: Aug. 11, 2017

(65) Prior Publication Data

US 2018/0044586 A1    Feb. 15, 2018

(30) Foreign Application Priority Data

Aug. 11, 2016  (KR) .................. 10-2016-0102567

(51) Int. Cl.
*C09K 11/08* (2006.01)
*C09K 11/02* (2006.01)
(Continued)

(52) U.S. Cl.
CPC ............ *C09K 11/08* (2013.01); *C09K 11/025* (2013.01); *H01L 33/06* (2013.01); *H01L 33/28* (2013.01);
(Continued)

(58) Field of Classification Search
CPC ................................ C09K 11/08; C09K 11/02
See application file for complete search history.

(56) References Cited

U.S. PATENT DOCUMENTS

| 2,921,950 A | 1/1960 | Jex et al. |
| 5,629,088 A | 5/1997 | Ogawa et al. |

(Continued)

FOREIGN PATENT DOCUMENTS

| KR | 2012-0062902 A | 6/2012 |
| KR | 2015-0034013 A | 4/2015 |

OTHER PUBLICATIONS

European Search Report dated Apr. 18, 2018, issued for the corresponding European Patent Application No. 17185722.0.
SciFinder, Glycidol, CAS Registry No. 556-52-5, 1 page (2018).

*Primary Examiner* — C Melissa Koslow
(74) *Attorney, Agent, or Firm* — Cantor Colburn LLP

(57) ABSTRACT

A quantum dot aggregate particle including a plurality of quantum dots, a polyvalent metal compound, and a thiol compound having at least two thiol groups at its end terminals, wherein a size of the quantum dot aggregate particle is in a range from about 20 nanometers to 10 micrometers.

26 Claims, 20 Drawing Sheets
(14 of 20 Drawing Sheet(s) Filed in Color)

(51) Int. Cl.
    *H01L 33/50*    (2010.01)
    *H01L 33/06*    (2010.01)
    *H01L 33/28*    (2010.01)
    *H01L 33/30*    (2010.01)
    *H01L 33/34*    (2010.01)

(52) U.S. Cl.
    CPC .............. *H01L 33/30* (2013.01); *H01L 33/34* (2013.01); *H01L 33/502* (2013.01); *C01P 2004/03* (2013.01); *C01P 2004/60* (2013.01); *C01P 2004/62* (2013.01); *H01L 2924/0001* (2013.01); *H01L 2933/0033* (2013.01)

(56) References Cited

U.S. PATENT DOCUMENTS

| | | |
|---|---|---|
| 6,171,515 B1 | 1/2001 | Evans et al. |
| 8,847,197 B2 | 9/2014 | Pickett et al. |
| 9,543,481 B2 | 1/2017 | Pickett et al. |
| 2006/0068203 A1 | 3/2006 | Ying et al. |
| 2006/0172133 A1 | 8/2006 | Naasani |
| 2009/0280327 A1 | 11/2009 | Ying et al. |
| 2010/0123155 A1 | 5/2010 | Pickett et al. |
| 2011/0084250 A1 | 4/2011 | Jang et al. |
| 2013/0123530 A1 | 5/2013 | Boehm et al. |
| 2013/0153837 A1 | 6/2013 | Hoshino et al. |
| 2015/0083970 A1 | 3/2015 | Koh et al. |
| 2016/0005932 A1* | 1/2016 | Lee .................... C09K 11/02 257/98 |
| 2018/0044583 A1* | 2/2018 | Kwon .................... C08K 3/16 |

* cited by examiner

DF (x 1000)

DF (x 1000)

FL (x 1000)

DF (x 1000)

FL (x 1000)

FL (x 1000)

DF (x 1000)

FL (x 1000)

QUANTUM DOT AGGREGATE PARTICLES, PRODUCTION METHODS THEREOF, AND COMPOSITIONS AND ELECTRONIC DEVICES INCLUDING THE SAME

CROSS-REFERENCE TO RELATED APPLICATION

This application claims priority to Korean Patent Application No. 10-2016-0102567 filed in the Korean Intellectual Property Office on Aug. 11, 2016, and all the benefits accruing therefrom under 35 U.S.C. § 119, the content of which is incorporated herein in its entirety by reference.

BACKGROUND

1. Field

A quantum dot aggregate particle, a composition and a composite including the aggregated particles, and an electronic device including the aggregated particles are disclosed.

2. Description of the Related Art

Quantum dots (e.g., nano-sized semiconductor nanocrystals) having different energy bandgaps may be obtained by controlling their sizes and compositions. Such quantum dots may emit light having various wavelengths.

However, the luminous properties and stabilities of the quantum dots are susceptible to external environment. Thus, the quantum dots are mixed with (e.g., dispersed in) a solid state matrix (e.g., a polymer matrix) to form a quantum dot polymer composite. Preparation processes of such composites may have substantial and adverse effects on their luminous properties. Thus, there remains a need to develop a technique for preventing, inhibiting, or reducing deterioration of properties of the quantum dots due to the external stimuli applied thereto for the application thereof.

SUMMARY

Some embodiments are related to a particle including quantum dots, which may show enhanced stability in subsequent processes for an application of a quantum dot.

Other embodiments are related to a quantum dot polymer composite including the foregoing particle and an electronic device including the same.

In some embodiments, a quantum dot aggregate particle includes a plurality of quantum dots, a polyvalent metal compound, and a thiol compound having at least two thiol groups at its end terminals, the aggregate particle having a size of about 20 nanometers to about 10 micrometers.

At least two quantum dots of the plurality of quantum dots may be linked to each other by the polyvalent metal compound, the thiol compound or both.

The quantum dot may include a Group II-VI compound, a Group III-V compound, a Group IV-VI compound, a Group IV element or compound, a Group I-III-VI compound, a Group I-II-IV-VI compound, or a combination thereof.

The polyvalent metal compound may include Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof.

The polyvalent metal compound may include an organometallic compound, an organic salt, an inorganic salt, or a combination thereof.

The polyvalent metal compound may be represented by Chemical Formula 1:

$$MA_n \qquad \text{Chemical Formula 1}$$

wherein

M is Mg, Ca, Sc, Ti, V, Cr, Mn, Fe, Co, Ni, Cu, Zn, Ga, Sr, Y, Zr, Nb, Mo, Cd, In, Ba, Au, Hg, or Tl, n is determined depending on the valency of the M and is an integer of greater than or equal to 2, A is each independently an organic group having a carbon number of less than or equal to 25, for example, less than or equal to 20, a halogen, or a combination thereof.

In Chemical Formula 1, the A may include a C2 to C5 hydrocarbyl group, RCOO— (wherein R is a C1 to C4 hydrocarbyl group), ROCO— (wherein R is a C1 to C4 hydrocarbyl group), $R_2N$—C(S)S— (wherein R is hydrogen, a C1 to C10 alkyl group, a C6 to C20 aryl group, or a combination thereof), chlorine, bromine, iodine, or a combination thereof.

The polyvalent metal compound may include a metal chloride, an alkylated metal, a metal acetate, a metal (meth)acrylate, a metal dialkyldithiocarbamate, or a combination thereof. The polyvalent metal compound may include zinc chloride, zinc (meth)acrylate, zinc acetate, a zinc dialkyldithiocarbamate, diethyl zinc, indium chloride, indium (meth)acrylate, indium acetate, or a combination thereof.

The thiol compound may be represented by Chemical Formula 2:

$$[R^1\!\!-\!\!]_{k1}\!\!-\!\!L_1\!\!-\!\![Y_1\!\!-\!\!(SH)_m]_{k2} \qquad \text{Chemical Formula 2}$$

wherein, $R^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C4 to C30 heteroarylalkyl group, a substituted or unsubstituted C3 to C30 cycloalkyl group, a substituted or unsubstituted C3 to C30 heterocycloalkyl group, a C1 to C10 alkoxy group, a hydroxy group, —$NH_2$, a substituted or unsubstituted C1 to C30 amine group (—NRR', wherein R and R' are independently hydrogen or a C1 to C30 linear or branched alkyl group, provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are independently hydrogen or a C1 to C20 linear or branched alkyl group), —C(=O)ONRR' (wherein R and R' are independently hydrogen or a C1 to C20 linear or branched alkyl group) or a combination thereof, $L_1$ is a carbon atom, a substituted or unsubstituted C1 to C30 alkylene group, a substituted or unsubstituted C2 to C30 alkylene group wherein at least one methylene (—$CH_2$—) is replaced with sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_1$ is a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—$CH_2$—) is replaced by sulfonyl (—$S(=O)_2$—), carbonyl (—$C(=O)$—), ether (—O—), sulfide (—S—), sulfoxide (—$S(=O)$—), ester (—$C(=O)O$—), amide (—$C(=O)NR$—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond, and provided that the sum of k1 and k2 does not exceed the valence of $L_1$.

The thiol compound may include a compound of Chemical Formula 2-1:

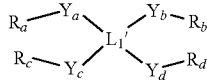

Chemical Formula 2-1 wherein $L_{1'}$ is carbon, a substituted or unsubstituted C2 to C20 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, each of $Y_a$ to $Y_d$ is independently a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—$CH_2$—) is replaced by sulfonyl (—$S(=O)_2$—), carbonyl (—$C(=O)$—), ether (—O—), sulfide (—S—), sulfoxide (—$S(=O)$—), ester (—$C(=O)O$—), amide (—$C(=O)NR$—) (wherein R is hydrogen or a C1 to C10 linear or branched alkyl group), imine (—NR—) (wherein R is hydrogen or a C1 to C10 linear or branched alkyl group), or a combination thereof, and each of $R_a$ to $R_d$ is $R^1$ of Chemical Formula 2 or SH, provided that at least two of $R_a$ to $R_d$ are SH.

The thiol compound may include ethoxylated pentaerythritol tetra(3-mercaptopropionate), trimethylolpropane tri(3-mercaptopropionate), trimethylolpropane-tri(2-mercaptoacetate), glycol di-3-mercaptopropionate, polypropylene glycol di(3-mercaptopropionate), ethoxylated trimethylolpropane tri(3-mercaptopropionate), glycol dimercaptoacetate, ethoxylated glycol dimercaptoacetate, 1,4-bis(3-mercaptobutyryloxy)butane, trimethylolpropane tris(3-mercaptopropionate), tris[2-(3-mercaptopropionyloxy)ethyl]isocyanurate, 1,3,5-tris(3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol, 1,3-propanedithiol, 1,2-ethanedithiol, a polyethylene glycol dithiol including 1 to 10 ethylene glycol repeating units, or a combination thereof.

The quantum dot aggregate particle may have a size of less than or equal to about 200 nanometers.

The quantum dot aggregate particle may include a polymer including a repeating unit having a carboxylic acid group (hereinafter, a carboxylic acid group containing polymer), a polymerization product of a polymerizable monomer including at least one (e.g., at least two) carbon-carbon double bond, or a combination thereof.

The carboxylic acid group containing polymer may include:

a copolymer of a monomer combination including a first monomer having a carboxylic acid group and a carbon-carbon double bond, a second monomer having a carbon-carbon double bond and a hydrophobic moiety and not having a carboxylic acid group, and optionally, a third monomer having a carbon-carbon double bond and a hydrophilic moiety and not having a carboxylic acid group;

a multiple aromatic ring-containing polymer having a backbone structure in a main chain and including a carboxylic acid group (—COOH), wherein the backbone structure includes a quaternary carbon atom, which is a part of a cyclic group, and two aromatic rings bound to the quaternary carbon atom; or a combination thereof.

The carboxylic acid group containing polymer may have an acid value of greater than or equal to about 50 milligrams of KOH per gram of the polymer.

The carboxylic acid group containing polymer may have an acid value of less than or equal to about 250 milligrams of KOH per gram of the polymer.

The carboxylic acid group containing polymer may have an acid value between about 120 milligrams of KOH per gram of the polymer and 200 milligrams of KOH per gram of the polymer.

In some embodiments, a method of producing the quantum dot aggregate particle includes:

mixing a plurality of quantum dots with a polyvalent metal compound and a thiol compound in an organic solvent to obtain a mixed solution, wherein the amount of the plurality of quantum dots, the amount of the polyvalent metal compound, and the amount of the thiol compound are controlled depending on a type of the organic solvent to form a quantum dot aggregate particle.

The method may further include stirring the mixed solution.

The method may further include adding a carboxylic acid group containing polymer, a mixture of a polymerizable (e.g., photopolymerizable) monomer including at least one (e.g., at least two) carbon-carbon double bond and a photoinitiator, a polymerization product of a polymerizable monomer comprising at least one carbon-carbon double bond, or a combination thereof.

The method may further include irradiating the mixed solution with UV rays.

The organic solvent may include a C1 to C10 halogenated hydrocarbon, a C1 to C10 alcohol, a (e.g., C1 to C15) glycol ether solvent, or a combination thereof.

In some embodiments, a composition includes the foregoing quantum dot aggregate particle, a carboxylic acid group containing polymer, a polymerizable (e.g., photopolymerizable) monomer including a carbon-carbon double bond; a photoinitiator; and a solvent.

The polymerizable monomer including a carbon-carbon double bond may include a monomer having at least one (meth)acrylate moiety.

The polymerizable monomer including a carbon-carbon double bond may include alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxyacrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof.

The composition may include:
about 0.01 weight percent to about 60 weight percent of the quantum dot aggregate particles;
about 0.005 weight percent to about 60 weight percent of the carboxylic acid group containing polymer;
about 0.005 weight percent to about 70 weight percent of the polymerizable monomer;
about 0.0001 weight percent to about 10 weight percent of the photoinitiator; and
a balance amount of the solvent,
based on the total weight of the composition.

In another embodiment, a quantum dot-polymer composite includes:
a polymer matrix, and (e.g., a plurality of) quantum dot aggregate particle(s) dispersed in the polymer matrix.

The polymer matrix may include a thiolene polymer, a (meth)acrylate polymer, a urethane polymer, an epoxy polymer, a vinyl polymer, a silicone polymer, or a combination thereof.

Some embodiments provide an electronic device including the quantum dot aggregate particle.

The electronic devices may include a light emitting diode, an organic light emitting diode, a sensor, an imaging sensor, a solar cell device, or a liquid crystal display device.

The quantum dot aggregate particle of the foregoing embodiments may have enhanced stability (e.g., heat stability, photo-stability, chemical stability, or the like), preventing and/or reducing deterioration of the properties of the quantum dot due to external environment during the application of the quantum dots. In addition, the method of forming the quantum dot aggregate particle of the embodiments may form a particle having a desired size while minimizing the deterioration of the properties via a relatively simple process.

BRIEF DESCRIPTION OF THE DRAWINGS

This patent or application file contains at least one drawing executed in color. Copies of this patent or patent application publication with color drawing(s) will be provided by the Office upon request and payment of the necessary fee.

These and/or other aspects will become apparent and more readily appreciated from the following description of the embodiments, taken in conjunction with the accompanying drawings in which.

DETAILED DESCRIPTION

Figure 1:
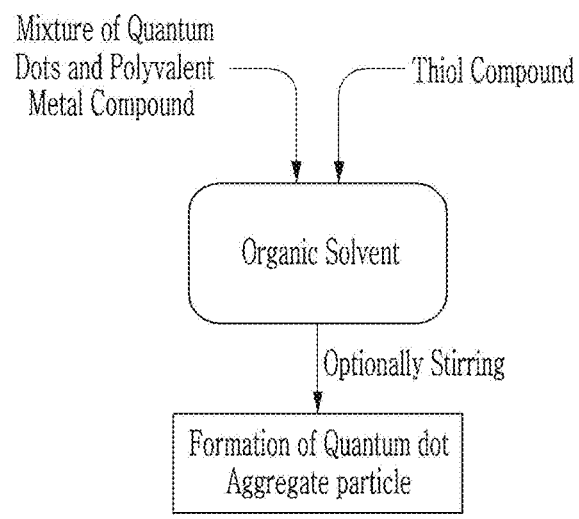
FIG. 1 is a schematic diagram illustrating a production method of quantum dot aggregate particles according to a non-limiting embodiment.

Advantages and characteristics of this disclosure, and a method for achieving the same, will become apparent referring to the following example embodiments together with the drawings attached hereto. However, the embodiments should not be construed as being limited to the embodiments set forth herein.

If not defined otherwise, all terms (including technical and scientific terms) in the specification may be defined as commonly understood by one skilled in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein. The terms defined in a generally-used dictionary may not be interpreted ideally or exaggeratedly unless clearly defined.

Accordingly, the embodiments are merely described below, by referring to the figures, to explain aspects of the present description. As used herein, the term "and/or" includes any and all combinations of one or more of the associated listed items. The term "or" means "and/or." Expressions such as "at least one of" when preceding a list of elements, modify the entire list of elements and do not modify the individual elements of the list.

It will be understood that when an element is referred to as being "on" another element, it may be directly on the other element or intervening elements may be present therebetween. In contrast, when an element is referred to as being "directly on" another element, there are no intervening elements present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an" and "the" are intended to include the plural forms as well, unless the context clearly indicates otherwise.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Mixture" as used herein is inclusive of all types of combinations, including blends, alloys, solutions, and the like.

Further, the singular includes the plural unless mentioned otherwise.

As used herein, when a definition is not otherwise provided, the term "substituted" refers to a compound or a group or a moiety wherein at least one of hydrogen atoms thereof is substituted with a substituent selected from a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 cycloalkenyl group, a C3 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1 to C20 alkyl" refers to a C1 to C20 alkyl group substituted with a C6 to C20 aryl group, the total number of carbon atoms in the resulting aryl substituted alkyl group is C7 to C40.

As used herein, the term "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C30 cycloalkenyl group, a C3 to C30 cycloalkynyl group, or a C2 to C30 heterocycloalkyl group.

As used herein, when a definition is not otherwise provided, the term "hetero" refers to inclusion of at least one (e.g., one to three) heteroatom(s) selected from N, O, S, Si, and P.

As used herein, when a definition is not otherwise provided, the term "alkyl group" refers to a group derived from a completely saturated, branched or unbranched (or a straight or linear) hydrocarbon and having a specified number of carbon atoms.

As used herein, when a definition is not otherwise provided, the term "alkoxy group" represents "alkyl-O—", wherein the term "alkyl" has the same meaning as described above.

As used herein, when a definition is not otherwise provided, the term "cycloalkyl group" refers to a monovalent group having one or more saturated rings in which all ring members are carbon.

As used herein, when a definition is not otherwise provided, the term "aryl" refers to an aromatic hydrocarbon group containing at least one ring and having the specified number of carbon atoms.

As used herein, the term "arylalkyl group" refers to a substituted or unsubstituted aryl group covalently linked to an alkyl group that is linked to a compound.

As used herein, the term "alkylene group" refers to a straight or branched saturated aliphatic hydrocarbon group having a valence of at least two, optionally substituted with one or more substituents.

As used herein, the term "cycloalkylene group" refers to a straight or branched saturated alicyclic hydrocarbon group having a valence of at least two, optionally substituted with one or more substituents.

As used herein, when a definition is not otherwise provided, the term "arylene group" refers to a functional group having a valence of at least two obtained by removal of at least two hydrogens in an aromatic ring, optionally substituted with one or more substituents.

As used herein, when a definition is not otherwise provided, the term "heteroarylene group" refers to a functional group having a valence of at least two obtained by removal of at least two hydrogens in an aromatic or aliphatic ring, containing at least one (e.g., one to three) heteroatoms selected from the group consisting of N, O, S, Si, and P as ring-forming elements, optionally substituted with one or more substituents where indicated, provided that the valence of the heteroarylene group is not exceeded.

As used herein, the term "aliphatic organic group" refers to a C1 to C30 linear or branched alkyl group, C2 to C30 linear or branched alkenyl group, and C2 to C30 linear or branched alkynyl group, the term "aromatic organic group" refers to a C6 to C30 aryl group or a C2 to C30 heteroaryl group, and the term "alicyclic organic group" refers to a C3 to C30 cycloalkyl group, a C3 to C30 cycloalkenyl group, and a C3 to C30 cycloalkynyl group.

As used herein, the term "(meth)acrylate" refers to acrylate and/or methacrylate.

As used herein, the term "hydrophobic moiety" refers to a moiety that causes a given compound including the same to show agglomeration in an aqueous solution and to have a tendency to repel water. For example, the hydrophobic moiety may include an aliphatic hydrocarbon group (alkyl, alkenyl, alkynyl, etc.) having a carbon number of greater than or equal to 1 (greater than or equal to 2), an aromatic hydrocarbon group having a carbon number of greater than or equal to 6 (phenyl, naphthyl, arylalkyl group, etc.), or an alicyclic hydrocarbon group having a carbon number of greater than or equal to 5 (cyclohexyl, norbornenyl, etc.). The hydrophobic moiety substantially lacks an ability to make a hydrogen bond with an ambient medium and is not substantially mixed with the medium as its polarity does not match that of the medium.

As used herein, the term "absolute quantum yield (Abs QY)" refers to the value calculated from the following equation:

[(the number of photons emitted from the quantum dot)/(the number of photons supplied to the quantum dot)]×100

For example, in the case of a green light emitting quantum dot, the "absolute quantum yield (Abs QY)" may be the ratio of the amount of the emitted green light with respect to the amount of the irradiated blue light.

As used herein, the term "dispersion" refers to a dispersion, wherein a dispersed phase is a solid and a continuous phase includes a liquid. For example, the term "dispersion" may refer to a colloidal dispersion wherein the dispersed phase has a dimension of about 1 nanometer (nm) to about several micrometers (μm) (e.g., 1 μm or less, 2 μm or less, or 3 μm or less).

As used herein, the "Group" refers to the group in the Periodic Table of Elements.

As used herein, "Group II" refers to Group IIA and Group IIB, and examples may include Cd, Zn, Hg, and Mg, but are not limited thereto.

"Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Ru, and Cs, but are not limited thereto.

As used herein, "Group V" refers to Group VA, and examples may include N, P, As, Sb, and Bi, but are not limited thereto.

As used herein, "Group VI" refers to Group VIA, and examples may include S, Se, and Te, but are not limited thereto.

In an embodiment, a quantum dot aggregate particle includes a plurality of quantum dots, a polyvalent metal compound, and a thiol compound having at least two thiol groups at its terminal ends. In the quantum dot aggregate particle, the plurality of quantum dots or at least two of them may be linked to one another by the polyvalent metal compound, the thiol compound, or a combination thereof.

The quantum dot (hereinafter also referred to as a semiconductor nanocrystal) is not particularly limited, and may be prepared by any known method or is a commercially available. For example, the quantum dot may be a Group II-VI compound, a Group III-V compound, a Group IV-VI compound, a Group IV element or compound, a Group I-III-VI compound, a Group I-II-IV-VI compound, or a combination thereof.

The Group II-VI compound may be selected from:
a binary element compound selected from CdSe, CdTe, ZnS, ZnSe, ZnTe, ZnO, HgS, HgSe, HgTe, MgSe, MgS, and a combination thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and
a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group II-VI compound may further include a Group III metal.

The Group III-V compound may be selected from:
a binary element compound selected from GaN, GaP, GaAs, GaSb, AlN, AlP, AlAs, AlSb, InN, InP, InAs, InSb, and a combination thereof;
a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, InZnP, and a combination thereof; and
a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group III-V compound may further include a Group II metal (e.g., InZnP).

The Group IV-VI compound may be selected from:
a binary element compound selected from SnS, SnSe, SnTe, PbS, PbSe, PbTe, and a combination thereof;
a ternary element compound selected from SnSeS, SnSeTe, SnSTe, PbSeS, PbSeTe, PbSTe, SnPbS, SnPbSe, SnPbTe, and a combination thereof; and
a quaternary element compound selected from SnPbSSe, SnPbSeTe, SnPbSTe, and a combination thereof.

Examples of the Group I-III-VI compound may include CuInSe$_2$, CuInS$_2$, CuInGaSe, and CuInGaS, but are not limited thereto.

Examples of the Group I-II-IV-VI compound may include CuZnSnSe and CuZnSnS, but are not limited thereto.

The Group IV element or compound may include:

an elementary substance selected from Si, Ge, and a combination thereof; and a binary element compound selected from SiC, SiGe, and a combination thereof.

The binary element compound, the ternary element compound or the quaternary element compound may be respectively included in a uniform concentration or in partially different concentrations within the same particle. The semiconductor nanocrystal particle may have a core-shell structure, wherein a first semiconductor nanocrystal (a core) is surrounded by a second semiconductor nanocrystal (a shell) that is different from the first semiconductor nanocrystal. At the interface between the core and the shell, an alloy interlayer may be present or may not be present. When the quantum dot has an alloy interlayer, the interface between the core and the shell may have a concentration gradient, wherein the concentration of an element of the shell changes (e.g., decreases or increases) toward the core. In addition, the shell may include a multi-layered shell having at least two layers. In the multi-layered shell, each layer may have a single composition, an alloy, or a composition having a concentration gradient.

In the core-shell semiconductor nanocrystal particle, the materials of the shell may have a larger energy bandgap than that of the core or vice versa. In the case of the multi-layered shell, the bandgap of the material of an outer layer of the shell may be higher energy than that of the material of an inner layer of the shell (a layer that is closer to the core).

The quantum dot (i.e., the semiconductor nanocrystal particle) may have a particle diameter (in the case of a non-spherically shaped particle, a longest length of a straight line crossing the particle) of about 1 nm to about 100 nm. For example, the quantum dot may have a particle diameter of about 1 nm to about 20 nm, for example, from 2 nm (or from 3 nm) to 15 nm. In some embodiments, the quantum dot have a diameter of greater than or equal to about 2 nm, greater than or equal to about 3 nm, greater than or equal to about 4 nm, or greater than or equal to about 5 nm and of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, less than or equal to about 15 nm, less than or equal to about 10 nm, less than or equal to about 9 nm, less than or equal to about 8 nm, or less than or equal to about 7 nm.

The quantum dot may have a generally-used shape in this art, and is not particularly limited. For example, the quantum dot may include spherical, ellipsoidal, pyramidal, multi-armed, or cubic nanoparticles, nanotubes, nanowires, nanofibers, nanoplate particles, a combination thereof, or the like.

The quantum dot is commercially available or may be synthesized by any method. For example, several nano-sized quantum dots may be synthesized by a wet chemical process. In the wet chemical process, precursors react in an organic solvent to grow nanocrystal particles, and the organic solvent or a ligand compound may coordinate (or be bound) to the surface of the semiconductor nanocrystal, thereby controlling the growth of the nanocrystal. Examples of the organic solvent and the ligand compound are known in the art. The organic solvent coordinated to the surface of the quantum dot may affect stability of a device, and thus, excess organic materials that are not coordinated to the surface of the quantum dot may be removed by pouring the quantum dot into an excessive amount of a non-solvent, and centrifuging the resulting mixture. Examples of the non-solvent may be acetone, ethanol, methanol, and the like, but are not limited thereto.

The quantum dot may have an organic ligand bonded to a surface thereof. The organic ligand may have a hydrophobic moiety. In an embodiment, the organic ligand may include RCOOH, $RNH_2$, $R_2NH$, $R_3N$, RSH, $R_3PO$, $R_3P$, ROH, RCOOR', $RPO(OH)_2$, $R_2POOH$ (wherein R and R' are independently a substituted or unsubstituted C5 to C24 aliphatic group such as a substituted or unsubstituted alkyl or alkenyl group, or a substituted or unsubstituted C5 to C20 aromatic group such as an aryl group), a polymeric organic ligand, or a combination thereof.

Examples of the organic ligand compound may include:

thiol compounds such as methane thiol, ethane thiol, propane thiol, butane thiol, pentane thiol, hexane thiol, octane thiol, dodecane thiol, hexadecane thiol, octadecane thiol, or benzyl thiol;

amine compounds such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, or trioctylamine;

carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid;

phosphine compounds such as methyl phosphine, ethyl phosphine, propyl phosphine, butyl phosphine, pentyl phosphine, octyl phosphine, dioctyl phosphine, tributyl phosphine, or trioctyl phosphine;

phosphine oxide compounds such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, or trioctyl phosphine oxide;

diphenyl phosphine, triphenyl phosphine, or oxide compounds thereof; a C5 to C20 alkylphosphinic acid such as hexylphosphinic acid, octylphosphinic acid, dodecylphosphinic acid, tetradecylphosphinic acid, hexadecylphosphinic acid, or octadecyl phosphinic acid;

a C5 to C20 alkylphosphonic acid; and the like, but are not limited thereto. The quantum dot may include the hydrophobic organic ligand alone or as a mixture of two or more.

The quantum dot may have a quantum yield (or a quantum efficiency) of greater than or equal to about 10%, for example, greater than or equal to about 30%, greater than or equal to about 50%, greater than or equal to about 60%, greater than or equal to about 70%, greater than or equal to about 90%, or even about 100%. The quantum dot may have a narrow full width half maximum (FWHM) of the photoluminescent spectrum. For example, the quantum dot may have a FWHM of less than or equal to about 45 nm, for example, less than or equal to about 40 nm, or less than or equal to about 30 nm.

The quantum dot may emit light of wavelength from an ultraviolet range to a visible range, even in a near infrared range or higher. For example, the quantum dot may emit light of a wavelength of about 350 to about 750 nm, for example, about 400 to about 700 nm or may emit light of greater than 700 nm, but it is not limited thereto. The quantum dot may emit light of a wavelength of greater than or equal to about 750 nm, e.g., greater than or equal to about 800 nm, greater than or equal to about 900 nm, or greater than or equal to about 1,000 nm.

The electronic device including the quantum dot having the foregoing photoluminescent properties is expected to be able to realize enhanced brightness and improved color purity or reproducibility. However, the luminescent properties of the quantum dot tend to decrease by the external environment and/or stimulus (e.g., air, moisture, heat and the like), and thus, improvement of the stability in terms of the photoluminescent properties are still desirable for the application of the quantum dot in the device.

As an attempt to increase the stability, a polymer composite including the quantum dot has been used. However, it has been known that mixing the quantum dots directly with a matrix polymer may lead to a serious decrease in their properties. In addition, the production of the quantum dot polymer composite entails a heat-treatment, which may in turn lead to a sharp decrease in the luminous properties of the quantum dots.

In this regard, the coating of the quantum dot with a highly heat resistant polymer such as polycarbonate or the encapsulation of the quantum dot with a polymer having a certain functional group have been proposed. However, such attempts tend to entail a complex process involving high production costs and special equipment. In addition, such attempts do not provide the stability that is necessary for the quantum dot composite.

In some embodiments, the quantum dot aggregate particle may show luminous properties that are improved in comparison with the original properties of the quantum dot, and may also show improved heat stability and enhanced chemical stability. Thus, the embodiments may inhibit or reduce deterioration of the luminous properties that would occur otherwise when the quantum dots are exposed to heat or mixed with a polymer.

Without wishing to be bound by any theory, a polyvalent metal ion derived from the polyvalent metal compound and the thiol compound having at least two thiol groups at its end terminals may interact with a surface of the quantum dot for the metal ion (e.g., Zn ion) or the thiol to be bound to the surface thereof and at the same time to form a link of metal (e.g., Zn)-sulfur (S). For example, a thiol group of the thiol compound is bound to the surface of the quantum dot and another thiol group (e.g., at an opposite terminal) of the thiol compound may form a metal (e.g., Zn) coordination by the polyvalent metal (e.g., Zn) ion that is already linked to another quantum dot via the thiol group, thereby at least two quantum dots may be linked with each other. As a result, the desired number of the quantum dots may be linked to each other without increasing (or even with decreasing) the number of defects on a surface thereof, and thereby the quantum dot aggregate particle of the embodiments may show improved luminous properties together with enhanced heat and chemical stability.

In the quantum dot aggregate particle, the polyvalent metal compound may include a metal selected from Mg, Ca, Sc, Ti, V, Cr, Mn, Fe, Co, Ni, Cu, Zn, Ga, Sr, Y, Zr, Nb, Mo, Cd, In, Ba, Au, Hg, Tl, and a combination thereof. In some embodiments, the polyvalent metal compound may include organometallic compound, an organic salt, an inorganic salt, or a combination thereof.

The polyvalent metal compound may be represented by Chemical Formula 1:

$$MA_n$$

wherein

M is Mg, Ca, Sc, Ti, V, Cr, Mn, Fe, Co, Ni, Cu, Zn, Ga, Sr, Y, Zr, Nb, Mo, Cd, In, Ba, Au, Hg, or Tl, n is an integer of greater than or equal to 2 and is determined depending on the valency of the M, A is each independently a halogen, an organic group having a carbon number of less than or equal to 25, for example, less than or equal to 23, less than or equal to 20, less than or equal to 18, less than or equal to 17, less than or equal to 16, less than or equal to 15, less than or equal to 13, less than or equal to 12, less than or equal to 11, less than or equal to 10, less than or equal to 9, less than or equal to 8, less than or equal to 7, less than or equal to 6, or less than or equal to 5, or a combination thereof. The organic group may have at least one, at least two, or at least three carbon atoms.

The A of Chemical Formula 1 may include a C2 to C5 hydrocarbyl group, RCOO— or ROCO— (wherein R is a C1 to C4 hydrocarbyl group), $R_2N$—C(S)S— (wherein R is hydrogen, a C1 to C10 alkyl group, a C6 to C20 aryl group, or a combination thereof), chlorine, bromine, iodine, or a combination thereof.

The polyvalent metal compound may include a metal chloride, an alkylated metal, a metal acetate, a metal (meth)acrylate, a metal dialkyldithiocarbamate, or a combination thereof. The polyvalent metal compound may include zinc chloride, zinc (meth)acrylate, zinc acetate, a zinc dialkyldithiocarbamate, dialkyl zinc such as diethyl zinc, indium chloride, indium (meth)acrylate, indium acetate, or a combination thereof.

The thiol compound may include a compound represented by Chemical Formula 2:

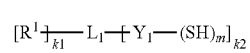

Chemical Formula 2 wherein, $R^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, —$NH_2$, a substituted or unsubstituted C1 to C30 amine group (—NRR', wherein R and R' are independently hydrogen or a C1 to C30 linear or branched alkyl group, provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' (wherein R and R' are independently hydrogen or a C1 to C20 linear or branched alkyl group), —C(=O)ONRR' (wherein R and R' are independently hydrogen or a C1 to C20 linear or branched alkyl group) or a combination thereof, $L_1$ is a carbon atom, a substituted or unsubstituted C1 to C30 alkylene group, a substituted or unsubstituted C2 to C30 alkylene group wherein at least one methylene (—$CH_2$—) is replaced with sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_1$ is a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond, and provided that the sum of k1 and k2 does not exceed the valence of $L_1$.

The thiol compound may include a compound represented by Chemical Formula 2-1:

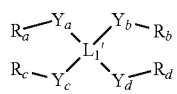

Chemical Formula 2-1 wherein $L_{1'}$ is carbon, a substituted or unsubstituted C2 to C20 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, each of $Y_a$ to $Y_d$ is independently a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of $R_a$ to $R_d$ is $R^1$ of Chemical Formula 2 or SH, provided that at least two of $R_a$ to $R_d$ are SH.

The thiol compound may include ethoxylated pentaerythritol tetra(3-mercaptopropionate), trimethylolpropane tri(3-mercaptopropionate), trimethylolpropane-tri(2-mercaptoacetate), glycol di-3-mercaptopropionate, polypropylene glycol di(3-mercaptopropionate), ethoxylated trimethylolpropane tri(3-mercaptopropionate), glycol dimercaptoacetate, ethoxylated glycol dimercaptoacetate, 1,4-bis(3-mercaptobutyryloxy)butane, tris[2-(3-mercaptopropionyloxy)ethyl]isocyanurate, 1,3,5-tris(3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol, 1,3-propanedithiol, 1,2-ethanedithiol, a polyethylene glycol dithiol including 1 to 10 ethylene glycol repeating units, or a combination thereof.

The quantum dot aggregate particle may include a polymerization product of a polymerizable monomer including at least one (e.g., at least two) carbon-carbon double bond, a polymer including a repeating unit having a carboxylic acid group (hereinafter, a carboxylic acid group containing polymer), which may act as a binder, and thus can also be referred to as "binder polymer" or "binder"), or a combination thereof. In some embodiments, the polymer and/or the polymerization product may be disposed on at least a portion of a surface of the quantum dot aggregate particle and/or within the aggregate particle. For example, the polymer and/or the polymerization product may surround the aggregate particle.

The photopolymerizable monomer including at least one carbon-carbon double bond may include a monomer having at least one (meth)acrylate moiety (hereinafter, also referred to as a photopolymerizable (meth)acrylate monomer). For example, the photopolymerizable monomer may include a mono(meth)acrylate compound, a di(meth)acrylate compound, a tri(meth)acrylate compound, a tetra(meth)acrylate compound, a penta(meth)acrylate compound, or a hexa(meth)acrylate compound. In some embodiments, the photopolymerizable monomer may include a compound having at least six (meth)acrylate moieties. Examples of the photopolymerizable monomer may include, but are not limited to, alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxyacrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris (meth)acryloyloxyethyl phosphate, and a combination thereof.

The photopolymerizable (meth)acrylate monomer may include a main monomer having 1 to 6 (meth)acrylate groups. If desired, the photopolymerizable (meth)acrylate monomer may include at least one of a first accessory monomer having 8 to 20 (meth)acrylate groups, and a second accessory monomer represented by Chemical Formula E:

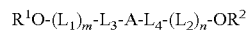

Chemical Formula E wherein,

A is a C1 to C40 aliphatic hydrocarbon group, a C6 to C40 aromatic hydrocarbon group, a divalent moiety including two or more C6 to C40 aromatic hydrocarbon groups linked by a substituted or unsubstituted C1 to C10 alkylene, an ether group, or a combination thereof, or an ether group (—O—), $L_1$ and $L_2$ are the same or different, and are each independently a substituted or unsubstituted C2 to C5 oxyalkylene, m and n are an integer of 0 to 20, provided that they are not simultaneously 0, $L_3$ and $L_4$ are the same or different, and are each independently a direct bond, —O—($CH_2$)$_p$—CH(OH)—$CH_2$—, or —($CH_2$)$_p$—CH(OH)—$CH_2$—, p is an integer of 0 to 5, and R[1] and R[2] are the same or different, and are each independently $CR_2=CR-$ (wherein, R is hydrogen or a methyl group) or $CR_2=CRCO-$ (wherein, R is hydrogen or a methyl group).

Types of the main monomer are not particularly limited but may include a (C1 to C6 alkyl) (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, trimethylol propane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof, but it is not limited thereto.

A quantum dot polymer composite including the first accessory monomer and/or the second accessory monomer may show improved developability and improved linearity during a patterning process even when the composition includes a large amount of quantum dots and/or an inorganic light diffusing agent.

The first accessory monomer may have at least 8, for example, at least 10, or at least 12 carbon-carbon double bonds (e.g., (meth)acrylate groups). The number of carbon-carbon double bonds of the first accessory monomer may be less than or equal to about 20. Without being bound by any theory, the introduction of the first accessory monomer increases the number of cross-linkable functional groups, and these functional groups may participate in a cross-linking reaction, thereby the composite may have greater density, and thus, the linearity of the resulting pattern may be improved.

The first accessory monomer may include a hyperbranched (meth)acrylate monomer. The hyperbranched monomer may have a regularly branched structure such as a dendrimer. In an embodiment, the hyperbranched monomer may have an incompletely branched or irregular structure. The first accessory monomer may further include at least one (for example, one to four) hydroxy groups, and the density and the developability of the patterned composite may be improved together. The first accessory monomer may be used alone or as a mixture of at least two compounds.

A weight average molecular weight of the first accessory monomer may be greater than or equal to about 300 grams per mole (g/mol), for example, from about 300 g/mol to about 10,000 g/mol, for example, from about 500 g/mol to about 800 g/mol. A weight average molecular weight of the first accessory monomer may be less than or equal to about 10,000 g/mol. The first accessory monomer may be synthesized by a known method or is commercially available (e.g., from Shin Nakamura Chemical Co., Ltd. or Nippon Kayaku Co., Ltd.).

The second accessory monomer may be represented by Chemical Formula E. For example, the second accessory monomer may be represented by one of Chemical Formula E-1 and Chemical Formula E-2:

Chemical Formula E-1

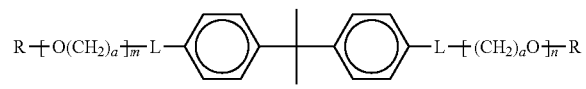

Chemical Formula E-2

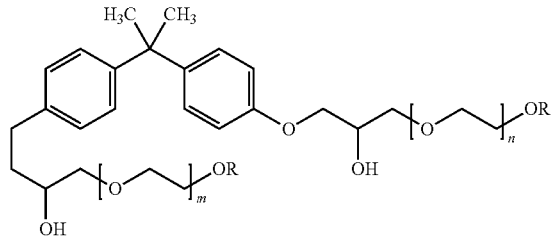

wherein,

R is the same or different, and are each independently $-COCR=CR_2$ (R is hydrogen or a methyl group), a is an integer of 1 to 5, m and n are the same as defined in Chemical Formula E, and L is the same or different, and is independently a direct bond, C1 to C10 alkylene, or an ether group (—O—).

In an exemplary embodiment, the second accessory monomer may include bisphenol A di(meth)acrylate, bisphenol A epoxy (meth)acrylate, bisphenol A ethylene glycol di(meth)acrylate, bisphenol A ethoxylate di(meth)acrylate, poly(ethylene glycol) reacted with bisphenol A glycidyl ether, or a combination thereof.

A weight average molecular weight of the second accessory monomer may be greater than or equal to about 300 g/mol, for example, from about 300 g/mol to about 10,000 g/mol, or from about 700 g/mol to about 1,500 g/mol.

When be used as a mixture, an amount of the main monomer may be greater than or equal to about 60 percent by weight (wt %), for example, greater than or equal to about 65 wt %, based on the total weight of the mixture of the photopolymerizable monomers. An amount of the main monomer may be less than or equal to about 90 wt %, for example, less than or equal to about 85 wt %, based on the total weight of the mixture of the photopolymerizable monomers.

The sum of the weight of the first accessory monomer and the second accessory monomer may be greater than or equal to about 10 wt %, for example, greater than or equal to about 15 wt %, based on the total weight of the mixture of the photopolymerizable monomers. The sum of the weight of the first accessory monomer and the second accessory monomer may be less than or equal to about 40 wt %, for example, less than or equal to 35 wt %, based on the total weight of the mixture of the photopolymerizable monomers.

When being used, the amount ratio (e.g., the weight ratio) between the first accessory monomer and the second accessory monomer (the amount of the first accessory monomer: the amount of the second accessory monomer) is about 1:0.1 to 1:10, for example, 1:0.2 to 1:5, 1:0.25 to 1:4, 1:0.5 to 1:2, 1:0.7 to 1:1.3, or 1:0.75 to 1:1.2. In other embodiments, the amount (e.g., the weight) of the first accessory monomer is the same or greater than that of the second accessory monomer, but it is not limited thereto.

In the composition, the carboxylic acid group containing polymer includes a copolymer of a monomer combination including a first monomer having a carboxylic acid group and a carbon-carbon double bond, a second monomer having a carbon-carbon double bond and a hydrophobic moiety and not having a carboxylic acid group, and optionally, a third monomer having a carbon-carbon double bond and a hydrophilic moiety and not having a carboxylic acid group;

a multiple aromatic ring-containing polymer having a backbone structure in a main chain and including a carboxylic acid group (—COOH), wherein the backbone structure includes a quaternary carbon atom, which is a part of a cyclic group, and two aromatic rings bound to the quaternary carbon atom; or a combination thereof.

The copolymer may include a first repeating unit derived from the first monomer, a second repeating unit derived from the second monomer, and optionally, a third repeating unit derived from the third monomer.

The first repeating unit may include a unit represented by Chemical Formula 1-1, a unit represented by Chemical Formula 1-2, or a combination thereof:

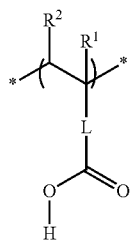

Chemical Formula 1-1 wherein
$R^1$ is hydrogen, a C1 to C3 alkyl group, or —$(CH_2)_n$—COOH (wherein n is 0 to 2),
$R^2$ is hydrogen, a C1 to C3 alkyl group, or —COOH,
L is a single bond, a divalent C1 to C15 aliphatic hydrocarbon group, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group, and
* indicates a portion linked to an adjacent atom;

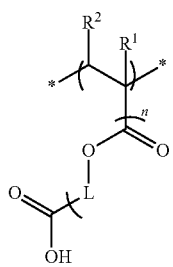

Chemical Formula 1-2 wherein $R^1$ is hydrogen, a C1 to C3 alkyl group, or —$(CH_2)_{n1}$—COOH (wherein n1 is 0 to 2),
$R^2$ is hydrogen or a C1 to C3 alkyl group,
L is a C1 to C15 alkylene group, a C1 to C15 alkylene group wherein at least one methylene group is substituted with —C(=O)—, —O—, or —C(=O)O—, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group,
n is an integer of 1 to 3, and
* indicates a portion linked to an adjacent atom.

The second repeating unit may include a unit represented by Chemical Formula 2-1, a unit represented by Chemical Formula 2-2, a unit represented by Chemical Formula 2-3, a unit represented by Chemical Formula 2-4, or a combination thereof:

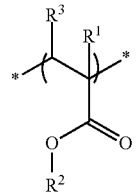

Chemical Formula 2-1 wherein
$R^1$ is hydrogen or a C1 to C3 alkyl group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
$R^3$ is hydrogen or a C1 to C3 alkyl group, and
* indicates a portion linked to an adjacent atom;

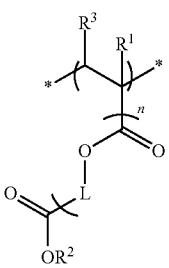

Chemical Formula 2-2 wherein
$R^1$ is hydrogen or a C1 to C3 alkyl group,
L is a divalent C1 to C15 alkylene group, a divalent C1 to C15 alkylene group wherein at least one methylene group is substituted with —C(=O)—, —O—, or —C(=O)O—, a divalent C6 to C30 aromatic hydrocarbon group, a divalent C3 to C30 alicyclic hydrocarbon group, or a divalent C1 to C15 aliphatic hydrocarbon group substituted with a divalent C6 to C30 aromatic hydrocarbon group or a C3 to C30 alicyclic hydrocarbon group,
$R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group,
$R^3$ is hydrogen or a C1 to C3 alkyl group,
n is an integer of 1 to 3, and
* indicates a portion linked to an adjacent atom;

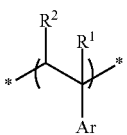

Chemical Formula 2-3 wherein
each of $R^1$ and $R^2$ is independently hydrogen or a C1 to C3 alkyl group, Ar is a substituted or unsubstituted C6 to C30 aromatic hydrocarbon group or a substituted or unsubstituted C3 to C30 alicyclic hydrocarbon group, and

* indicates a portion linked to an adjacent atom;

Chemical Formula 2-4

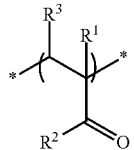

wherein

R$^1$ is hydrogen or a C1 to C3 alkyl group,

R$^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, R$^3$ is hydrogen or a C1 to C3 alkyl group, and

* indicates a portion linked to an adjacent atom.

The third repeating unit derived from the third monomer may be represented by Chemical Formula 3:

Chemical Formula 3

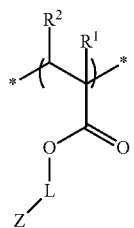

wherein each of R$^1$ and R$^2$ is independently hydrogen or a C1 to C3 alkyl group, L is a divalent C1 to C15 alkylene group, a divalent C1 to C15 alkylene group wherein at least one methylene group is substituted with —C(=O)—, —O—, or —C(=O)O—, a divalent C6 to C30 aromatic hydrocarbon group, a divalent C3 to C30 alicyclic hydrocarbon group, or a divalent C1 to C15 aliphatic hydrocarbon group substituted with a C6 to C30 aromatic hydrocarbon group or a C3 to C30 alicyclic hydrocarbon group, Z is a hydroxyl group (—OH), a mercapto group (—SH), or an amino group (—NHR, wherein R is hydrogen or a C1 to C5 alkyl group), and

* indicates a portion linked to an adjacent atom.

Examples of the first monomer may include, but are not limited to, acrylic acid, methacrylic acid, maleic acid, itaconic acid, fumaric acid, 3-butenoic acid, carboxylic acid vinyl ester compounds such as vinyl acetate, and vinyl benzoate. The first monomer may include one or more compounds.

Examples of the second monomer may include, but are not limited to:

alkenyl aromatic compounds such as styrene, α-methyl styrene, vinyl toluene, or vinyl benzyl methyl ether;

unsaturated carboxylic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate;

unsaturated carboxylic acid amino alkyl ester compounds such as 2-amino ethyl acrylate, 2-amino ethyl methacrylate, 2-dimethyl amino ethyl acrylate, or 2-dimethyl amino ethyl methacrylate;

maleimides such as N-phenylmaleimide, N-benzylmaleimide, N-alkylmaleimide;

unsaturated carboxylic acid glycidyl ester compounds such as glycidyl acrylate or glycidyl methacrylate;

vinyl cyanide compounds such as acrylonitrile or methacrylonitrile; and unsaturated amide compounds such as acrylamide or methacrylamide, but are not limited thereto.

As the second monomer, at least one compound may be used.

Examples of the third monomer may include 2-hydroxy ethyl acrylate, 2-hydroxy ethyl methacrylate, 2-hydroxy butyl acrylate, and 2-hydroxy butyl methacrylate, but are not limited thereto. The third monomer may include one or more compounds.

In the carboxylic acid group containing polymer, an amount of the first repeating unit derived from the first monomer may be greater than or equal to about 10 mole percent (mol %), for example, greater than or equal to about 15 mol %, greater than or equal to about 25 mol %, or greater than or equal to about 35 mol %. In the binder polymer (i.e., the carboxylic acid group containing polymer), an amount of the first repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 45 mol %, less than or equal to about 35 mol %, or less than or equal to about 25 mol %.

In the carboxylic acid group containing polymer, an amount of the second repeating unit derived from the second monomer may be greater than or equal to about 10 mol %, for example, greater than or equal to about 15 mol %, greater than or equal to about 25 mol %, or greater than or equal to about 35 mol %. In the binder polymer, an amount of the second repeating unit may be less than or equal to about 90 mol %, for example, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 65 mol %, less than or equal to about 40 mol %, less than or equal to about 35 mol %, or less than or equal to about 25 mol %.

If present, an amount of the third repeating unit derived from the third monomer in the carboxylic acid group containing polymer may be greater than or equal to about 1 mol %, for example, greater than or equal to about 5 mol %, greater than or equal to about 10 mol %, or greater than or equal to about 15 mol %. In the binder polymer, an amount of the third repeating unit may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

In an embodiment, the carboxylic acid group containing polymer may be a copolymer of (meth)acrylic acid (i.e., the first monomer) and at least one second or third monomer selected from aryl or alkyl(meth)acrylate, hydroxyalkyl (meth)acrylate, and styrene. For example, the binder polymer may include a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

In another embodiment, the carboxylic acid group containing polymer may include a multiple aromatic ring-containing polymer. The multiple aromatic ring-containing polymer has a main chain including a backbone structure and includes a carboxylic acid group (—COOH). The backbone structure includes a quaternary carbon atom, which is a part of a cyclic group, and two aromatic rings bound to the quaternary carbon atom (for example, carboxylic acid group (—COOH) may be bound to the main chain).

In the multiple aromatic ring-containing polymer, the backbone structure may include a unit represented by Chemical Formula A':

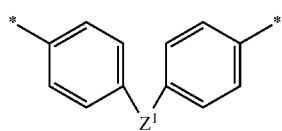

Chemical Formula A' wherein

* indicates a portion that is linked to an adjacent atom of the main chain of the polymer, and $Z^1$ is a linking moiety represented by any one of Chemical Formulae A-1 to A-6, and in Chemical Formulae A-1 to A-6, and * indicates a portion that is linked to an adjacent atom:

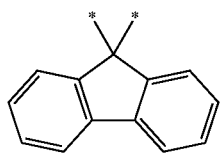

Chemical Formula A-1

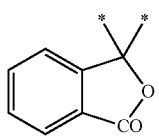

Chemical Formula A-2

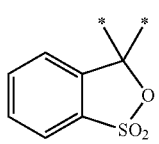

Chemical Formula A-3

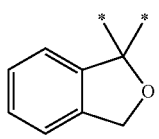

Chemical Formula A-4

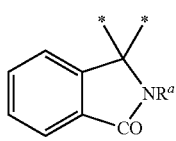

Chemical Formula A-5 wherein $R^a$ is hydrogen, an ethyl group, $C_2H_4Cl$, $C_2H_4OH$, $CH_2CH=CH_2$, or a phenyl group,

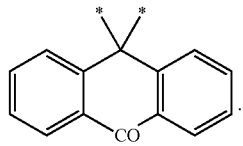

Chemical Formula A-6

The multiple aromatic ring-containing polymer may include a structural unit represented by Chemical Formula B:

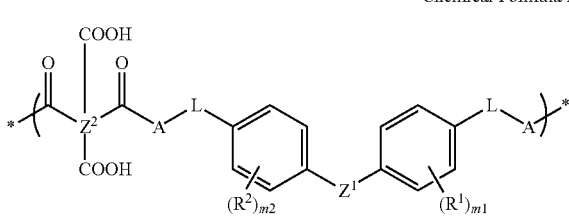

Chemical Formula B wherein $Z^1$ is a linking moiety represented by any one of Chemical Formulae A-1 to A-6, L is a single bond, a C1 to C10 alkylene, a C1 to C10 alkylene having a substituent including a carbon-carbon double bond, a C1 to C10 oxy alkylene, or a C1 to C10 oxy alkylene having a substituent including a carbon-carbon double bond, A is —NH—, —O—, or a C1 to C10 alkylene, each of $R^1$ and $R^2$ is independently hydrogen, a halogen, or a substituted or unsubstituted C1 to C20 alkyl group, m1 and m2 are independently an integer ranging from 0 to 4, $Z^2$ is a C6 to C40 aromatic organic group, and

* indicate a portion that is linked to an adjacent atom.

In Chemical Formula B, $Z^2$ may be any one of Chemical Formula B-1, Chemical Formula B-2, and Chemical Formula B-3:

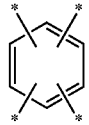

Chemical Formula B-1 wherein * indicates a portion that is linked to an adjacent carbonyl carbon,

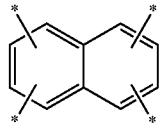

Chemical Formula B-2 wherein * indicates a portion that is linked to an adjacent carbonyl carbon, Chemical Formula B-3

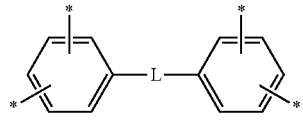

Chemical Formula B-3 wherein * indicates a portion that is linked to an adjacent carbonyl carbon,

L is a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR$_2$— (wherein R is independently hydrogen, a C1 to C10 aliphatic hydrocarbon group, a C6 to C20 aromatic hydrocarbon group, or a C6 to C20 alicyclic hydrocarbon group), —C(CF$_3$)$_2$—, —C(CF$_3$)(C$_6$H$_5$)—, or —C(=O)NH—.

The multiple aromatic ring-containing polymer may include a structural unit represented by Chemical Formula C:

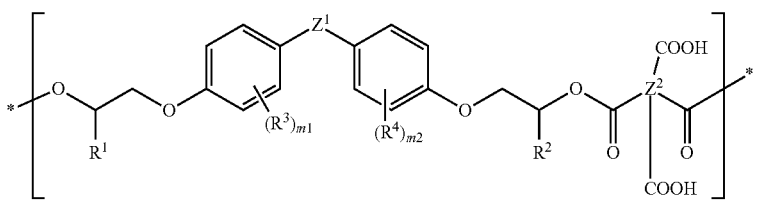

Chemical Formula C wherein each of R$^1$ and R$^2$ is independently hydrogen or a substituted or unsubstituted (meth)acryloyloxyalkyl group, each of R$^3$ and R$^4$ is independently hydrogen, a halogen, or a substituted or unsubstituted C1 to C20 alkyl group, Z$^1$ is a moiety selected from linking moieties represented by Chemical Formulae A-1 to A-6, Z$^2$ is an aromatic organic group such as the moieties set forth above, m1 and m2 are independently an integer ranging from 0 to 4, and

* indicates a portion that is linked to an adjacent atom.

In some embodiments, the multiple aromatic ring-containing polymer may be an acid adduct of bisphenol fluorene epoxy acrylate. For example, the bisphenol fluorene epoxy acrylate may be prepared by reacting 4,4-(9-fluorenylidene)-diphenol and epichlorohydrine to obtain an epoxy compound having a fluorene moiety, and the epoxy compound is reacted with an acrylic acid to obtain a fluorenyl epoxy acrylate, which is then further reacted with biphenyl dianhydride and/or phthalic anhydride. The aforementioned reaction scheme may be summarized as follows:

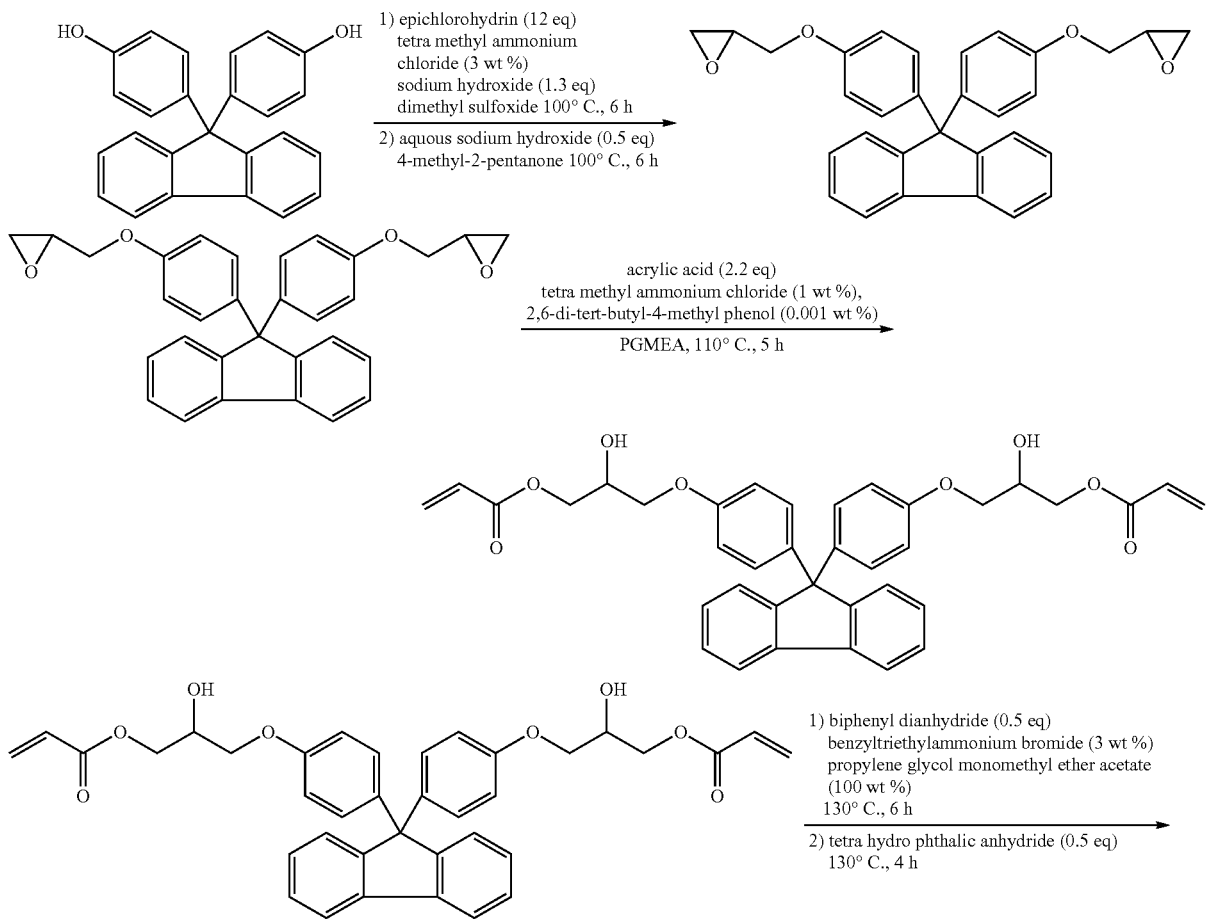

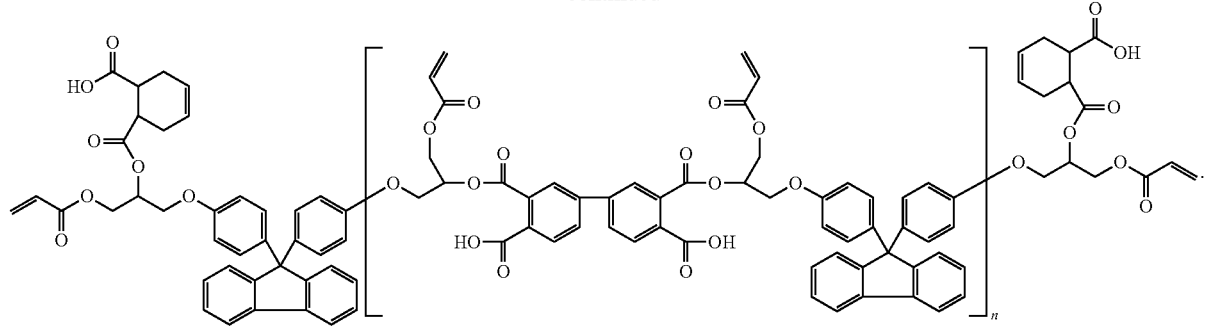

The multiple aromatic ring-containing polymer may include a functional group represented by Chemical Formula D at one or both terminal ends:

Chemical Formula D

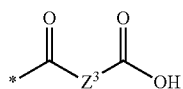

wherein

* indicates a portion that is linked to an adjacent atom, and $Z^3$ is a moiety represented by one of Chemical Formulae D-1 to D-7:

Chemical Formula D-1

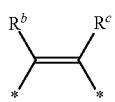

wherein each of $R^b$ and $R^c$ is independently hydrogen, a substituted or unsubstituted C1 to C20 alkyl group, a substituted or unsubstituted C1 to C20 alkyl group, wherein at least one methylene is replaced with an ester group, an ether group, or a combination thereof and

* indicates a portion that is linked to an adjacent atom.

Chemical Formula D-2

Chemical Formula D-3

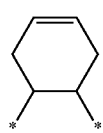

Chemical Formula D-4

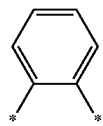

Chemical Formula D-5

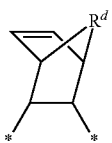

wherein $R^d$ is O, S, NH, a substituted or unsubstituted C1 to C20 alkylene group, a C1 to C20 alkylamine group, or a C2 to C20 alkenylamine group.

Chemical Formula D-6

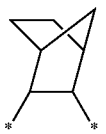

Chemical Formula D-7

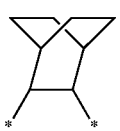

The multiple aromatic ring-containing polymer may be synthesized by a known method or may be commercially available (e.g., from Nippon Steel Chemical Co., Ltd.).

As non-limiting examples, the multiple aromatic ring-containing polymer may include a reaction product of a fluorene compound selected from 9,9-bis(4-hydroxyphenyl)fluorene, 9,9-bis(4-aminophenyl)fluorene, 9,9-bis[4-(glycidyloxy)phenyl]fluorene, 9,9-bis[4-(2-hydroxyethoxy)phenyl]fluorene, and 9,9-bis-(3,4-dicarboxyphenyl)fluorene dianhydride with an appropriate compound capable of reacting with the fluorene compound (e.g., an aromatic dianhydride selected from pyromellitic dianhydride (PDMA), biphenyltetracarboxylic dianhydride (BPDA), benzophenone tetracarboxylic dianhydride, and naphthalene tetracarboxylic dianhydride, a C2 to C30 diol compound, epichlorohydrine, or the like).

The fluorene compound, dianhydrides, a diol compound, and the like are commercially available, and the reaction conditions therebetween are known in the art.

The carboxylic acid group containing polymer may have an acid value of greater than or equal to about 50 milligrams of KOH per gram of the polymer (mg KOH/g). For example, the carboxylic acid group containing polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The binder polymer (i.e., carboxylic acid group containing polymer) may have an acid value of, for example, less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, less than or equal to about 170 mg KOH/g, or less than or equal to about 160 mg KOH/g, but it is not limited thereto.

The quantum dot aggregate particle may have a size (e.g., an average size) of about 20 nm to about 10 μm. In some embodiments, the size (e.g., the average size) of the quantum dot aggregate particle(s) may be greater than or equal to about 20 nm, for example, greater than or equal to about 30 nm, greater than or equal to about 40 nm, greater than or equal to about 50 nm, greater than or equal to about 60 nm, greater than or equal to about 70 nm, greater than or equal to about 80 nm, greater than or equal to about 90 nm, or greater than or equal to about 100 nm. In some embodiments, the size (e.g., the average size) of the quantum dot aggregate particle(s) may be less than or equal to about 10 μm, for example, less than or equal to about 9 μm, less than or equal to about 8 μm, less than or equal to about 7 μm, less than or equal to about 6 μm, less than or equal to about 5 μm, less than or equal to about 4 μm, or less than or equal to about 3 μm. The (average) size of the aggregate particle(s) may be measured by a Dynamic light scattering method.

In the conventional arts, a micrometer sized particle including quantum dots have been prepared by an emulsion/dispersion polymerization of a monomer mixture including quantum dots or by micronizing a prepared quantum dot polymer composite. The emulsion/dispersion polymerization may produce a fine particle including the quantum dots dispersed in a polymer matrix. However, in the foregoing conventional method, the control of the particle size is difficult and the production method of the fine particle itself tends to cause deterioration of the properties of the quantum dots. In contrast, the quantum dot aggregate particle of the embodiments may be produced to have a desired size within a relatively short time period via a relatively mild and simple method (e.g., by controlling an amount of each of the components such as the quantum dots, the polyvalent metal compound and its concentration in a predetermined organic solvent). The size of the quantum dot aggregate particle may be controlled depending on the application type of the quantum dot. For example, when a thin film including quantum dots is produced, the particle size may be controlled to have a size that is much smaller than a thickness of the film. In some embodiments, the (average) size of the quantum dot aggregate particle may be less than or equal to about 200 nm. In the case of a quantum dot polymer composite having a predetermined thickness of at least a micrometer, the size of the quantum dot aggregate particle may be greater than or equal to about 0.1 μm, for example, greater than or equal to about 0.5 μm, or greater than or equal to about 1 μm.

Thus, a method of producing the quantum dot aggregate particle of the embodiments includes mixing a plurality of quantum dots with a polyvalent metal compound and a thiol compound having at least two thiol groups at its end terminals in an organic solvent to obtain a mixed solution. The mixing order of the plurality of quantum dots, the polyvalent metal compound, and the thiol compound is not particularly limited. In some embodiments, the thiol compound and a mixture of the quantum dots and the polyvalent metal compound may be added to the organic solvent (see FIG. 1).

Details of the quantum dots, the polyvalent metal compound, and the thiol compound are the same as set forth above. The organic solvent may include a C1 to C10 halogenated hydrocarbon such as chloroform, a C1 to C10 alcohol such as methanol, ethanol, propanol, iso-propanol, butanol, and the like, a glycol solvent such as an alkylene glycols (e.g., ethylene glycol, propylene glycol, diethylene glycol, polyalkylene glycol), a glycol ether (e.g. glycol monoalkyl ether, glycol dialkyl ether), and glycol ether ester (e.g., glycol ether acetate), C6 to C20 aliphatic hydrocarbon such as hexane, heptane, octane and the like, a substituted or unsubstituted aromatic hydrocarbon such as toluene, xylene, benzene, ethyl benzene, or a combination thereof.

The glycol solvent may include a glycol monoalkyl ether solvent such as diethylene glycol monomethyl ether, ethylene glycol monomethyl ether, ethylene glycol monoethyl ether, ethylene glycol monopropyl ether, ethylene glycol monoiso-propyl ether, ethylene glycol monobutyl ether, ethylene glycol monophenyl ether, ethylene glycol monobenzyl ether, diethylene glycol monomethyl ether, diethylene glycol monoethyl ether, diethylene glycol mono n-butyl ether, propylene glycol monomethyl ether, propylene glycol monoethyl ether, propylene glycol monopropyl ether, and propylene glycol monobutyl ether; a diether derivative of the foregoing glycol monoalkyl ether solvent such as ethylene glycol dimethyl ether, ethylene glycol diethyl ether, ethylene glycol dibutyl ether, diethylene glycol dimethyl ether, propylene glycol dimethyl ether, dipropylene glycol dimethyl ether, propylene glycol diethyl ether, and dipropylene glycol diethyl ether; an ester derivative of the foregoing glycol monoalkyl ether solvent such as, ethylene glycol monoethyl ether acetate, diethylene glycol monoethyl ether acetate, ethylene glycol monomethyl ether acetate, ethylene glycol monopropylether acetate, ethylene glycol monobutyl ether acetate, propylene glycol monomethyl ether acetate (PGMEA), and dipropylene glycol monoethyl ether acetate; and ethylene glycol acetate.

In the method of the embodiments, depending on the types of the organic solvent, each of the amounts of the quantum dots, the polyvalent metal compound, and the thiol compound is controlled to form a quantum dot aggregate particle.

For example, when the organic solvent is the C1 to C10 halogenated hydrocarbon such as chloroform, the amount of the quantum dots in the mixed solution may be, but is not limited to, per 100 parts by weight of the organic solvent, greater than or equal to about 0.01 parts by weight, for example greater than or equal to about 0.1 parts by weight, greater than or equal to about 0.2 parts by weight, greater than or equal to about 0.3 parts by weight, or greater than or equal to about 0.4 parts by weight, and less than or equal to about 40 parts by weight, for example, less than or equal to about 39 parts by weight, less than or equal to about 38 parts by weight, less than or equal to about 37 parts by weight, less than or equal to about 36 parts by weight, less than or equal to about 35 parts by weight, less than or equal to about 34 parts by weight, less than or equal to about 33 parts by weight, less than or equal to about 32 parts by weight, less than or equal to about 31 parts by weight, or less than or equal to about 30 parts by weight;

the amount of the polyvalent metal compound in the mixed solution may be, but is not limited to, per 100 parts by weight of the quantum dots, greater than or equal to about 0.1 parts by weight, for example, greater than or equal to about 0.2 parts by weight, greater than or equal to about 0.3 parts by weight, greater than or equal to about 0.4 parts by weight, greater than or equal to about 0.5 parts by weight, greater than or equal to about 0.6 parts by weight, greater than or equal to about 0.7 parts by weight, greater than or equal to about 0.8 parts by weight, greater than or equal to about 0.9 parts by weight, greater than or equal to about 1 parts by weight, greater than or equal to about 2 parts by weight, greater than or equal to about 3 parts by weight, greater than or equal to about 4 parts by weight, or greater than or equal to about 5 parts by weight, and less than or equal to about 60 parts by weight, for example, less than or equal to about 50 parts by weight, less than or equal to about 45 parts by weight, less than or equal to about 40 parts by weight, less than or equal to about 35 parts by weight, less than or equal to about 30 parts by weight, less than or equal to about 25 parts by weight, less than or equal to about 20 parts by weight, or less than or equal to about 19 parts by weight, less than or equal to about 18 parts by weight, less than or equal to about 17 parts by weight, less than or equal to about 16 parts by weight, less than or equal to about 15 parts by weight, less than or equal to about 14 parts by weight, less than or equal to about 13 parts by weight, less than or equal to about 12 parts by weight, or less than or equal to about 11 parts by weight; and the amount of the thiol compound in the mixed solution may be, but is not limited to, per 100 parts by weight of the quantum dots, greater than or equal to about 1 parts by weight, for example greater than or equal to about 2 parts by weight, greater than or equal to about 3 parts by weight, greater than or equal to about 4 parts by weight, or greater than or equal to about 5 parts by weight, and less than or equal to about 40 parts by weight, for example, less than or equal to about 30 parts by weight, or less than or equal to about 25 parts by weight.

In other embodiments, the organic solvent is an alcohol such as ethanol, propanol, iso-propanol, or a mixture thereof, and the amount of the quantum dots in the mixed solution may be, but is not limited to, per 100 parts by weight of the organic solvent, greater than or equal to 0.01 parts by weight, for example greater than or equal to 0.1 parts by weight, greater than or equal to about 0.2 parts by weight, greater than or equal to about 0.3 parts by weight, or greater than or equal to about 0.4 parts by weight, and less than or equal to about 40 parts by weight, for example, less than or equal to about 39 parts by weight, less than or equal to about 38 parts by weight, less than or equal to about 37 parts by weight, less than or equal to about 36 parts by weight, less than or equal to about 35 parts by weight, less than or equal to about 34 parts by weight, less than or equal to about 33 parts by weight, less than or equal to about 32 parts by weight, less than or equal to about 31 parts by weight, or less than or equal to about 30 parts by weight;

the amount of the polyvalent metal compound may be, but is not limited to, per 100 parts by weight of the quantum dot, greater than or equal to about 0.1 parts by weight, for example greater than or equal to about 0.2 parts by weight, greater than or equal to about 0.3 parts by weight, greater than or equal to about 0.4 parts by weight, greater than or equal to about 0.5 parts by weight, greater than or equal to about 0.6 parts by weight, greater than or equal to about 0.7 parts by weight, greater than or equal to about 0.8 parts by weight, greater than or equal to about 0.9 parts by weight, or greater than or equal to about 1 parts by weight, and less than or equal to about 60 parts by weight, for example, less than or equal to about 50 parts by weight, less than or equal to about 45 parts by weight, less than or equal to about 40 parts by weight, less than or equal to about 35 parts by weight, less than or equal to about 30 parts by weight, less than or equal to about 25 parts by weight, less than or equal to about 20 parts by weight, or less than or equal to about 19 parts by weight, less than or equal to about 18 parts by weight, less than or equal to about 17 parts by weight, less than or equal to about 16 parts by weight, less than or equal to about 15 parts by weight, less than or equal to about 14 parts by weight, less than or equal to about 13 parts by weight, less than or equal to about 12 parts by weight, or less than or equal to about 11 parts by weight; and the amount of the thiol compound may be, but is not limited to, per 100 parts by weight of the quantum dots, greater than or equal to about 1 parts by weight, for example greater than or equal to about 2 parts by weight, greater than or equal to about 3 parts by weight, greater than or equal to about 4 parts by weight, or greater than or equal to about 5 parts by weight, and less than or equal to about 40 parts by weight, for example, less than or equal to about 30 parts by weight, or less than or equal to about 25 parts by weight.

In some embodiments, the organic solvent is a glycol ether solvent such as PGMEA, the amount of the quantum dots in the mixed solution may be, but is not limited to, per 100 parts by weight of the organic solvent, greater than or equal to about 0.01 parts by weight, for example greater than or equal to about 0.02 parts by weight, greater than or equal to about 0.05 parts by weight, greater than or equal to about 0.06 parts by weight, greater than or equal to about 0.07 parts by weight, greater than or equal to about 0.08 parts by weight, greater than or equal to about 0.09 parts by weight, greater than or equal to about 0.1 parts by weight, greater than or equal to about 0.15 parts by weight, or greater than or equal to about 0.2 parts by weight, and less than or equal to about 40 parts by weight, for example, less than or equal to about 30 parts by weight, less than or equal to about 25 parts by weight, less than or equal to about 20 parts by weight, less than or equal to about 15 parts by weight, less than or equal to about 10 parts by weight, less than or equal to about 9 parts by weight, less than or equal to about 8 parts by weight, or less than or equal to about 7 parts by weight;

the amount of the polyvalent metal compound may be, but is not limited to, per 100 parts by weight of the quantum dots, greater than or equal to about 0.1 parts by weight, for example greater than or equal to about 0.2 parts by weight, greater than or equal to about 0.3 parts by weight, greater than or equal to about 0.4 parts by weight, greater than or equal to about 0.5 parts by weight, greater than or equal to about 0.6 parts by weight, greater than or equal to about 0.7 parts by weight, greater than or equal to about 0.8 parts by weight, greater than or equal to about 0.9 parts by weight, or greater than or equal to about 1 parts by weight, and less than or equal to about 60 parts by weight, for example, less than or equal to about 50 parts by weight, less than or equal to about 40 parts by weight, less than or equal to about 30 parts by weight, less than or equal to about 20 parts by weight, less than or equal to about 15 parts by weight, less than or equal to about 14 parts by weight, less than or equal to about 13 parts by weight, less than or equal to about 12 parts by weight, less than or equal to about 11 parts by weight, less than or equal to about 10 parts by weight, less than or equal to about 9 parts by weight, or less than or equal to about 8 parts by weight; and the amount of the thiol compound may be, but is not limited to, per 100 parts by weight of the quantum dots, greater than or equal to about 0.1 parts by weight, for example greater than or equal to about 0.2 parts by weight, greater than or equal to about 0.3 parts by weight, greater than or equal to about 0.4 parts by weight, greater than or equal to about 0.5 parts by weight, greater than or equal to about 0.6 parts by weight, greater than or equal to about 0.7 parts by weight, greater than or equal to about 0.8 parts by weight, greater than or equal to about 0.9 parts by weight, greater than or equal to about 1 parts by weight, greater than or equal to about 2 parts by weight, greater than or equal to about 3 parts by weight, greater than or equal to about 4 parts by weight, or greater than or equal to about 5 parts by weight, and less than or equal to about 40 parts by weight, for example, less than or equal to about 35 parts by weight, less than or equal to about 30 parts by weight, less than or equal to about 29 parts by weight, less than or equal to about 28 parts by weight, less than or equal to about 27 parts by weight, or less than or equal to about 26 parts by weight.

The size of the quantum dot aggregate particle may be controlled by adjusting the types and the concentration of the quantum dots, the types and the concentration of the polyvalent metal compounds, and the types and the concentration of the thiol compound in a given organic solvent.

The method may further include stirring a mixed solution. The time of stirring is not particularly limited but greater than or equal to about 10 seconds, for example, greater than or equal to about 30 seconds, greater than or equal to about 1 minute, greater than or equal to about 5 minutes, or greater than or equal to about 10 minutes. The temperature of the stirring is not particularly limited but may be selected considering the types of the organic solvent. For example, the stirring may be conducted at a temperature of greater than or equal to about −20° C., for example greater than or equal to about −10° C., greater than or equal to about −1° C., greater than or equal to about 0° C., and greater than or equal to about 10° C., and less than or equal to about 60° C., for example, less than or equal to about 50° C., less than or equal to about 40° C., or less than or equal to about 30° C. The stirring may be conducted at room temperature such as 20° C. to 30° C.

The stirring atmosphere is not particularly limited but may be selected appropriately. For example, the stirring may be conducted in the air, or under inert or non-oxygen atmosphere such as nitrogen, argon, or the like.

The method may further include adding a carboxylic acid group containing polymer, a mixture of a photopolymerizable monomer having at least one (e.g., at least two) carbon-carbon double bond and a photoinitiator, or a combination thereof to the organic solvent. Thus, the quantum dot aggregate particle prepared thereby may further include a carboxylic acid group containing polymer, a polymerization product of the foregoing monomers, or a combination thereof. The carboxylic acid group containing polymer and the photopolymerizable monomer are the same as set forth above. The manner/order of the addition of the carboxylic acid group containing polymer and/or the mixture of the photopolymerizable monomer and the photoinitiator may be selected appropriately and are not particularly limited. For example, the carboxylic acid group containing polymer and the mixture of the photopolymerizable monomer and the photoinitiator may be mixed with at least one of the quantum dots, the polyvalent metal salt, and the thiol compound and then added to the organic solvent.

The photoinitiator is a compound capable of initiating a radical polymerization of the photopolymerizable monomer (e.g., acyclic monomer) and/or the thiol compound. Types of the photoinitiator are not particularly limited. For example, the available photopolymerization initiator may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, or a combination thereof, but it is not limited thereto.

In a non-limiting example, the examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxy phenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis(trichloromethyl)-6-styryl-s-triazine, 2-(naphth-1-yl)-4,6-bis(trichloromethyl)-s-triazine, 2-(4-methoxynaphth-1-yl)-4,6-bis(trichloromethyl)-s-triazine, 2,4-bis(trichloromethyl)(piperonyl)-s-triazine, and 2,4-bis(trichloromethyl)(6-paramethoxy styryl)-s-triazine, but are not limited thereto.

Examples of the acetophenone compound may be 2,2'-diethoxyacetophenone, 2,2'-dibutoxyacetophenone, 2-hydroxy-2-methylpropinophenone, p-t-butyltrichloroacetophenone, p-t-butyldichloro acetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, but are not limited thereto.

Examples of the benzophenone compound may be benzophenone, benzoyl benzoate, methylbenzoyl benzoate, 4-phenylbenzophenone, hydroxybenzophenone, acrylated benzophenone, 4,4'-bis(dimethylamino)benzophenone, 4,4'-dichlorobenzophenone, 3,3'-dimethyl-2-methoxybenzophenone, and the like, but are not limited thereto.

Examples of the thioxanthone compound may be thioxanthone, 2-methylthioxanthone, 2-isopropylthioxanthone, 2,4-diethylthioxanthone, 2,4-diisopropylthioxanthone, 2-chlorothioxanthone, and the like, but are not limited thereto.

Examples of the benzoin compound may include benzoin, benzoin methyl ether, benzoin ethyl ether, benzoin isopropyl ether, benzoin isobutyl ether, benzyl dimethyl ketal, and the like, but are not limited thereto.

Examples of the oxime compound may be 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, and the like, but are not limited thereto.

In the mixture, an amount of the photoinitiator is not particularly limited but may be selected appropriately.

The method of the embodiments may further include irradiating UV rays having a predetermined intensity to the mixed solution to initiate polymerization of the photopolymerizable monomer. The intensity and the irradiation time are not particularly limited and may be selected appropriately. For example, the intensity (e.g., amount of light) and the irradiation time may be selected so as to initiate a polymerization reaction considering the types of the monomer, the types of the photoinitiator, and the like.

In some embodiments, a composition includes the foregoing quantum dot aggregate particle, a carboxylic acid group containing polymer, a photopolymerizable monomer having at least one carbon-carbon double bond (e.g., a (meth)acrylate moiety), a photoinitiator, and a solvent. The composition may further include the aforementioned thiol compound. The quantum dot aggregate particle, the carboxylic acid group containing polymer, the photopolymerizable monomer, the thiol compound, the photoinitiator, the solvent are the same as set forth above.

The composition may include, about 0.01 weight percent to about 60 weight percent of the quantum dots;

about 0.005 weight percent to about 60 weight percent of the carboxylic acid group containing polymer;

about 0.005 weight percent to about 70 weight percent of the polymerizable monomer (e.g. photopolymerizable monomer);

about 0.0001 weight percent to about 10 weight percent of the photoinitiator; and a balance amount of the solvent, based on the total weight of the composition.

In the composition, an amount of the quantum dot aggregate particle may be greater than or equal to about 0.01 wt %, for example, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, or greater than or equal to about 15 wt % based on the total amount of the composition. The amount of the quantum dot including the organic ligand may be less than or equal to about 60 wt %, for example, less than or equal to about 55 wt %, less than or equal to about 50 wt %, less than or equal to about 45 wt %, less than or equal to about 40 wt %, or less than or equal to about 35 wt %, based on the total amount of the composition. In some embodiments, the amount of the quantum dot may be about 1 wt % to 70 wt %, based on a total weight of solid contents (non-volatile components) of the compositions and this amount may correspond to the amount of the quantum dot in the quantum dot polymer composite.

In the composition, an amount of the carboxylic acid group containing polymer may be greater than or equal to about 0.005 wt %, for example, greater than or equal to about 0.5 wt %, greater than or equal to about 1 wt %, greater than or equal to about 5 wt %, greater than or equal to about 10 wt %, greater than or equal to about 15 wt %, or greater than or equal to about 20 wt % based on the total weight of the composition. An amount of the carboxylic acid group containing polymer may be less than or equal to about 60 wt %, for example, less than or equal to about 55 wt %, less than or equal to about 50 wt %, less than or equal to about 45 wt %, less than or equal to about 40 wt %, less than or equal to about 35 wt %, or less than or equal to about 30 wt % based on the total weight of the composition. In an embodiment, an amount of the carboxylic acid group containing polymer may be 0.5 to 70 wt % based on the total weight of solids (i.e., non-volatiles) of the composition.

In the composition, the amount of the photopolymerizable monomer may be greater than or equal to about 0.005 wt %, for example, greater than or equal to about 1 wt %, or greater than or equal to about 2 wt % with respect to a total amount of the composition. The amount of the photopolymerizable monomer may be less than or equal to about 70 wt %, for example less than or equal to about 65 wt %, less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 19 wt %, less than or equal to about 18 wt %, less than or equal to about 17 wt %, less than or equal to about 16 wt %, or less than or equal to about 15 wt %.

In the composition, an amount of the photoinitiator may be greater than or equal to about 0.0001 wt %, for example, greater than or equal to about 0.01 wt %, greater than or equal to about 0.1 wt %, or greater than or equal to about 1 wt %, based on the total weight of the composition. The amount of the photoinitiator may be less than or equal to about 10 wt %, for example, less than or equal to about 5 wt %, based on the total weight of the composition. In an embodiment, the amount of the photoinitiator may be about 0.05 to about 10 wt % based on the total weight of solids (i.e., non-volatiles) of the composition.

If desired, the composition may further include various additives such as a light diffusing agent, a leveling agent, or a coupling agent, in addition to the aforementioned components. The amount of the additive is not particularly limited, and may be selected within an appropriate range, wherein the additive does not cause an adverse effect on the preparation of the composition, the preparation of the quantum dot polymer composite, and optionally, the patterning of the composite.

The light diffusing agent may increase a refractive index of the composition in order to increase a chance of the incident light to meet with quantum dots. The light diffusing agent may include fine particles of an inorganic oxide such as alumina, silica, zirconia, barium oxide, titanium oxide, or zinc oxide, and fine particle of a metal such as gold, silver, copper, or platinum, but is not limited thereto.

The leveling agent is aimed to prevent stains or spots and to improve planarization and leveling characteristics of a film, and examples thereof may include the following but are not limited thereto. For example, a fluorine-containing leveling agent may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428®, and the like of Toray Silicone Co., Ltd.

The coupling agent is aimed to increase adhesion with respect to the substrate, and examples thereof may include a silane coupling agent. Examples of the silane coupling agent may be vinyl trimethoxysilane, vinyl tris(2-methoxyethoxy)silane, 3-glycidoxypropyltrimethoxysilane, 2-(3,4-epoxycyclohexyl)ethyltrimethoxysilane, 3-chloropropylmethyldimethoxysilane, 3-chloropropyltrimethoxysilane, 3-methacryloxylpropyltrimethoxysilane, 3-mercaptopropyltrimethoxysilane, and the like. Types and the amounts of the additives may be adjusted, if desired.

If present, the amount of the additives may be greater than or equal to about 0.1 wt %, for example, greater than or equal to about 0.5 wt %, greater than or equal to about 1 wt %, greater than or equal to about 2 wt %, or greater than or equal to about 5 wt %, but it is not limited thereto. If present, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, but it is not limited thereto.

Types of the solvent included in the composition are not particularly limited. Types and the amount of the solvent may be determined depending on the types and the amounts of the foregoing main components (i.e., the quantum dots, the COOH group containing polymer, the thiol compound, the photopolymerizable monomer combination, and the photoinitiator), and other additives. The composition may include the solvent in such an amount that the remaining amount of the composition other than the amounts of the solid (i.e., non-volatiles) components is the amount of the solvent. The solvent may be selected appropriately considering its affinity for other components (e.g., the binder, the photopolymerizable monomer, the photoinitiator, and other additives) and its boiling point.

Examples of the solvent may include the foregoing a glycol solvent, N-methyl pyrrolidone, an amides such as dimethylformamide and dimethyl acetamide, a ketone such as methyl ethyl ketone (MEK), methyl isobutyl ketone (MIBK), and cyclohexanone, an aliphatic/aromatic hydrocarbon such as toluene, xylene, petroleum such as solvent naphtha, an ester solvent such as ethyl acetate, butyl acetate, ethyl lactate, and the like, an ether solvent such as diethyl ether, dipropyl ether, dibutyl ether, and the like, or a combination thereof. Each of the components of the composition may be mixed sequentially or simultaneously and the order is not particularly limited. The polymerization of the composition may provide a quantum dot polymer composite. The composite, thus obtained, may be subjected to a post-heating, for example, at a temperature of about 150° C. to 230° C. (e.g., 180° C.) for a predetermined time (e.g., greater than or equal to about 10 min or greater than or equal to about 20 min).

Another embodiment provides a quantum dot-polymer composite, which includes:

a polymer matrix; and the foregoing quantum dot aggregate particles dispersed in the polymer matrix. The polymer matrix may include a thiolene polymer, a (meth)acrylate polymer, a urethane polymer, a carboxylic acid group containing polymer, an epoxy polymer, a vinyl polymer, a silicone polymer, or a combination thereof.

In the composite, an amount of quantum dots may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, or greater than or equal to about 15 wt % based on the total amount of the composite. The amount of the quantum dot may be less than or equal to about 70 wt %, for example, less than or equal to about 60 wt %, less than or equal to about 55 wt %, less than or equal to about 50 wt %, less than or equal to about 45 wt %, less than or equal to about 40 wt %, less than or equal to about 35 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on the total amount of the composite.

In the composite, an amount of the polymer matrix may be greater than or equal to about 30 wt %, for example, greater than or equal to about 35 wt %, greater than or equal to about 40 wt %, greater than or equal to about 45 wt %, greater than or equal to about 50 wt % based on the total weight of the composite. An amount of the polymer matrix may be less than or equal to about 99 wt %, for example, less than or equal to about 98 wt %, less than or equal to about 97 wt %, less than or equal to about 96 wt %, less than or equal to about 95 wt %, less than or equal to about 94 wt %, less than or equal to about 93 wt %, less than or equal to about 92 wt %, less than or equal to about 91 wt %, less than or equal to about 90 wt %, less than or equal to about 89 wt %, less than or equal to about 88 wt %, less than or equal to about 87 wt %, less than or equal to about 86 wt %, less than or equal to about 85 wt %, less than or equal to about 84 wt %, less than or equal to about 83 wt %, less than or equal to about 82 wt %, less than or equal to about 81 wt %, less than or equal to about 80 wt %, or less than or equal to about 75 wt % based on the total weight of the composite.

Still other embodiments provide an electronic device including the foregoing quantum dot aggregate particle. The electronic device may include a light emitting diode (LED), an organic light emitting diode (OLED), a sensor, a solar cell device, imaging sensor, or a liquid crystal display device, but it is not limited thereto. The quantum dot polymer composite may include a repeating pattern including a plurality of sections of at least two different colors (e.g., RGB sections). The pattern of the quantum dot polymer composite may replace an absorption type color filter in a liquid crystal display and find its utility in a photoluminescent color filter.

Figure 2:
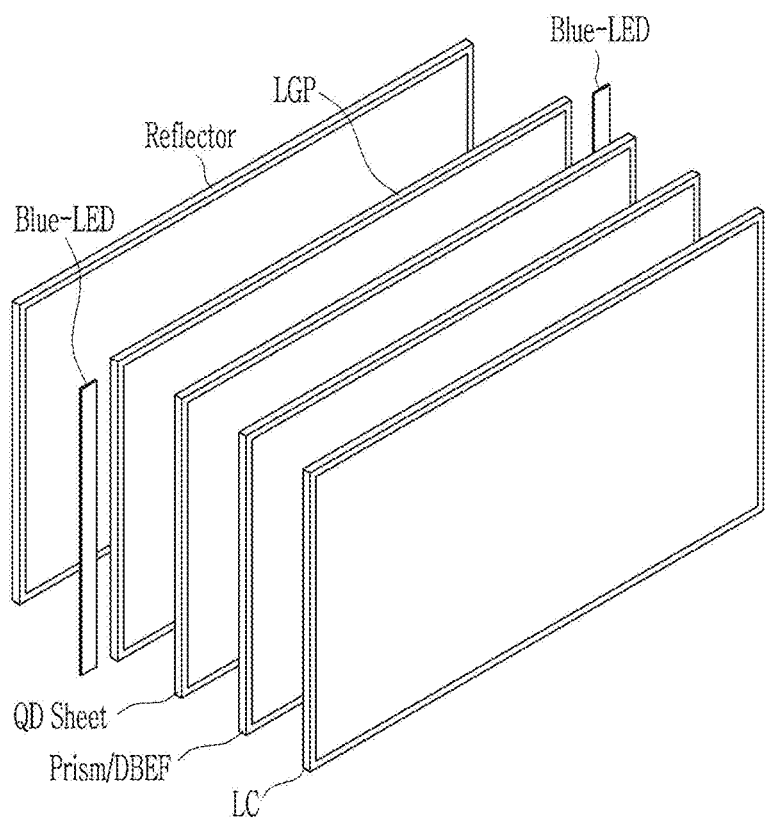
FIG. 2 is an exploded view of an electronic device, according to a non-limiting embodiment.

In some non-limiting embodiments, a schematic layered structure of a liquid crystal display device including the quantum dot sheet is shown in FIG. 2. A general structure of the LCD is known in the art and FIG. 2 schematically shows the same.

Referring to FIG. 2, the liquid crystal display may include a reflector, a light guide panel (LGP), a Blue LED, a quantum dot polymer composite sheet (QD sheet), various optical sheets such as a prism sheet, a double brightness enhance film (DBEF), which are layered to form a layered structure, and a liquid crystal panel may be disposed on the top of the layered structure.

Figure 3:
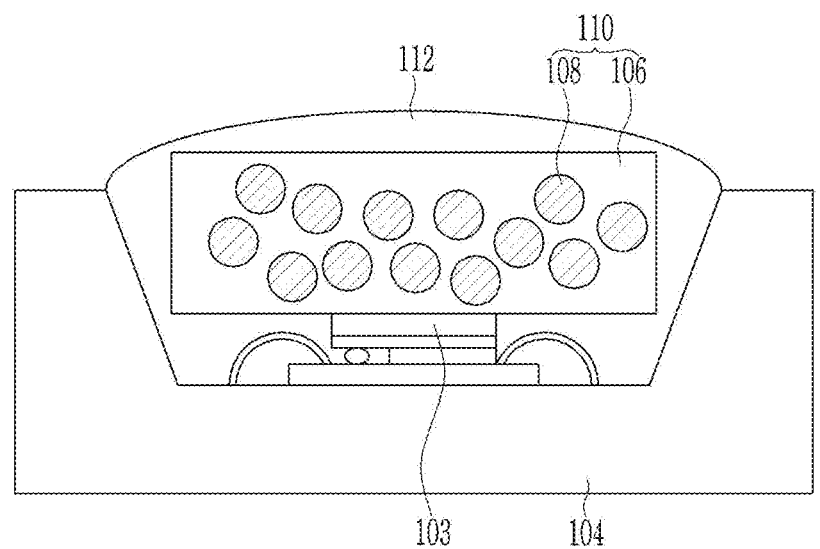
FIG. 3 is a cross-sectional view of an electronic device, according to a non-limiting embodiment.

According to some non-limiting embodiments, a cross-section of a light emitting device including a quantum dot aggregate is shown in FIG. 3. In FIG. 3, the light emitting device may include a substrate 104, a light emitting diode chip 103, an encapsulation resin 112, and a quantum dot polymer composite 110. The quantum dot aggregate particles 108 are dispersed in a polymer matrix 106.

Hereinafter, the embodiments are illustrated in more detail with reference to examples. However, the present disclosure is not limited thereto.

EXAMPLES

Analysis Method

[1] Microscopic Analysis

ECLIPS 100D, NICON microscope is used to analyze the obtained quantum dot aggregate particles by a Dark Field microscopy and a Fluorescence microscopy.

[2] Measurement of Particle Size by the Dynamic Light Scattering Method

By using ELS-Z2 PLUS, OTSUKA, a particle (average) size and a standard deviation thereof are measured in accordance with the DLS method.

[3] Absolute Quantum Yield of the Quantum Dot Polymer Composite

A quantum dot polymer composite film is placed in an integrating sphere and a blue light source is applied. An absolute quantum yield is calculated from a ratio between the number of the photons supplied to the quantum dot polymer composite film and the number of the photons emitted from the quantum dot polymer composite film.

[4] Scanning Electron Microscopic Analysis

A Scanning Electron Microscopic Analysis is made by using SU-8030, HITACHI.

Preparation of Core-Shell Quantum Dots

Reference Example: Preparation of Red Light Emitting Quantum Dots and Green Light Emitting Quantum Dots (1) 0.2 millimoles (mmol) of indium acetate, 0.6 mmol of palmitic acid, and 10 milliliters (mL) of 1-octadecene are placed in a flask, heated under vacuum at 120° C. for one hour, and heated to 280° C. after the atmosphere in the flask is exchanged with $N_2$. Then, a mixed solution of 0.1 mmol of tris(trimethylsilyl)phosphine ($TMS_3P$) and 0.5 mL of trioctylphosphine (TOP) is quickly injected, and the reaction proceeds for a predetermined time (e.g., for 20 minutes). The reaction mixture then is rapidly cooled and acetone is added thereto to produce nanocrystals, which are then separated by centrifugation and dispersed in toluene. The first absorption maximum in UV-VIS spectrum of the InP core nanocrystals, thus prepared, may be in the range of 420 to 600 nanometers (nm).

0.3 mmol (0.056 grams, g) of zinc acetate, 0.6 mmol (0.189 g) of oleic acid, and 10 mL of trioctylamine are placed in a flask, heated under vacuum at 120° C. for 10 minutes, and then heated to 220° C. after the atmosphere in the flask is exchanged with $N_2$. Then, a toluene dispersion of the InP core nanocrystals prepared above (optical density: 0.15) and 0.6 mmol S/TOP (i.e., sulfur dissolved or dispersed in the TOP) are added to the flask, and then, the resulting mixture is heated to 280° C., and the reaction proceeds for 30 minutes. After the reaction, the reaction solution is quickly cooled to room temperature to obtain a reaction mixture including InP/ZnS semiconductor nanocrystals.

(2) An excess amount of ethanol is added to the reaction mixture including the InP/ZnS semiconductor nanocrystals, which is then centrifuged. After centrifugation, the supernatant is discarded and the precipitate is dried and dispersed in chloroform. A UV-vis absorption spectrum of the resulting dispersion is measured. The prepared semiconductor nanocrystals emit green or red light.

Preparation of Quantum Dot Aggregate Particles I

Examples 1-1 to 1-4

[1] The chloroform dispersion of the green light emitting quantum dots prepared in Reference Example is added to a solution of a binder polymer of a four membered copolymer of methacrylic acid, benzyl methacrylate, hydroxyethyl methacrylate, and styrene, acid value: 130 milligrams (mg) per gram of KOH (mg KOH/g), molecular weight: 8,000 g/mol, acrylic acid:benzyl methacrylate:hydroxyethyl methacrylate:styrene (molar ratio)=61.5%:12%:16.3%:10.2%) (in polypropylene glycol monomethyl ether acetate, a concentration of 30 percent by weight, wt %) to form a quantum dot-binder dispersion. To the quantum dot-binder dispersion as prepared, glycol di-3-mercaptopropionate (hereinafter, 2T) having the following structure, hexaacrylate having the following structure (as a photopolymerizable monomer), and an oxime ester compound (as an initiator) are added to obtain a QD/PR composition. The QD/PR composition does not include a dispersant, e.g., sodium dodecyl sulfate (SDS).

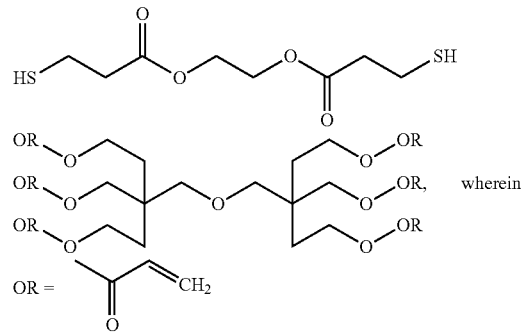

wherein $OR = \overset{O}{\underset{}{\|}} \overset{}{\underset{}{\diagup}} CH_2$

[2] $ZnCl_2$ is dissolved in an iso-propyl alcohol (IPA, Example 1-1), ethanol (Et-OH, Example 1-2), chloroform (CF, Example 1-3), and PGMEA (Example 1-4) to obtain a polyvalent metal compound solution. A predetermined amount of the QD/PR composition is added to each of the polyvalent metal compound solutions to obtain a mixed solution. In the mixed solution, the amount of the quantum dot is 1 part by weight with respect to 100 parts by weight of the organic solvent and the amount of the polyvalent metal compound is 45 parts by weight with respect to 100 parts by weight of the quantum dots and the amount of the thiol compound is 37.5 parts by weight with respect to 100 parts by weight of the quantum dots.

UV rays are irradiated to the obtained mixed solution, which is then stirred for 3 hours to form a precipitate (QD aggregate particles).

The dynamic light scattering technique is used to measure an average size of the quantum dot aggregate particles and a standard deviation thereof. The results are shown in Table 1.

TABLE 1

|  | Avg. particle size (nm) | Standard Deviation (nm) |
| --- | --- | --- |
| Example 1-1 (IPA-Zn) | 1740 | 370 |
| Example 1-2 (EtOH—Zn) | 1760 | 400 |
| Example 1-3 (CF-Zn) | 3410 | 780 |
| Example 1-4 (PGMEA-Zn) | 80 | 20 |

Figure 4:
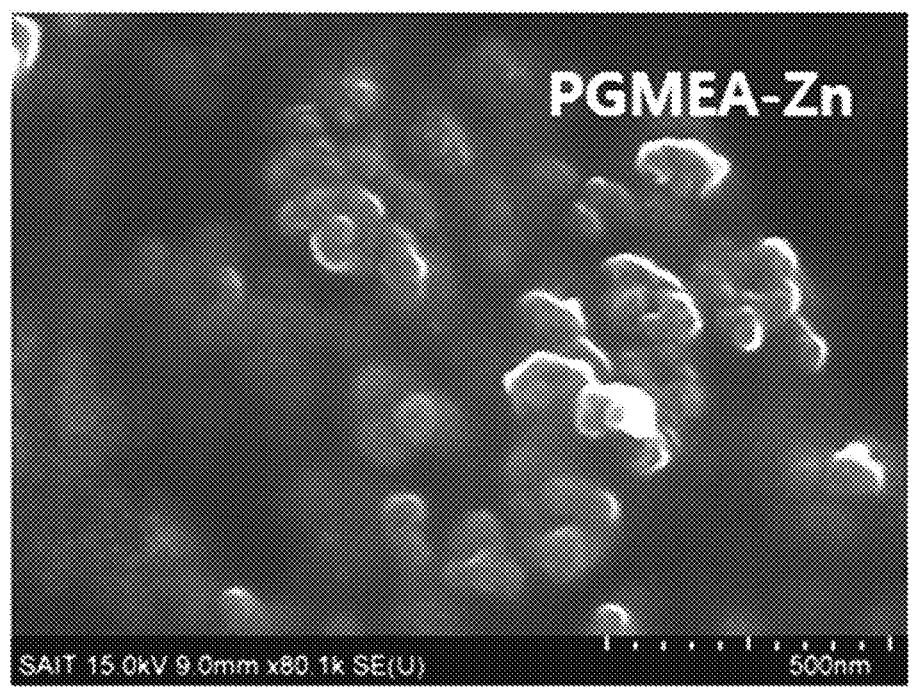
FIG. 4 is a scanning electron microscopic image of the quantum dot aggregate particle prepared in Example 1-4.

[3] The aggregate particles prepared in Example 1-4 are separated by centrifugation and their scanning electron microscopic image is shown in FIG. 4.

Figure 5A:
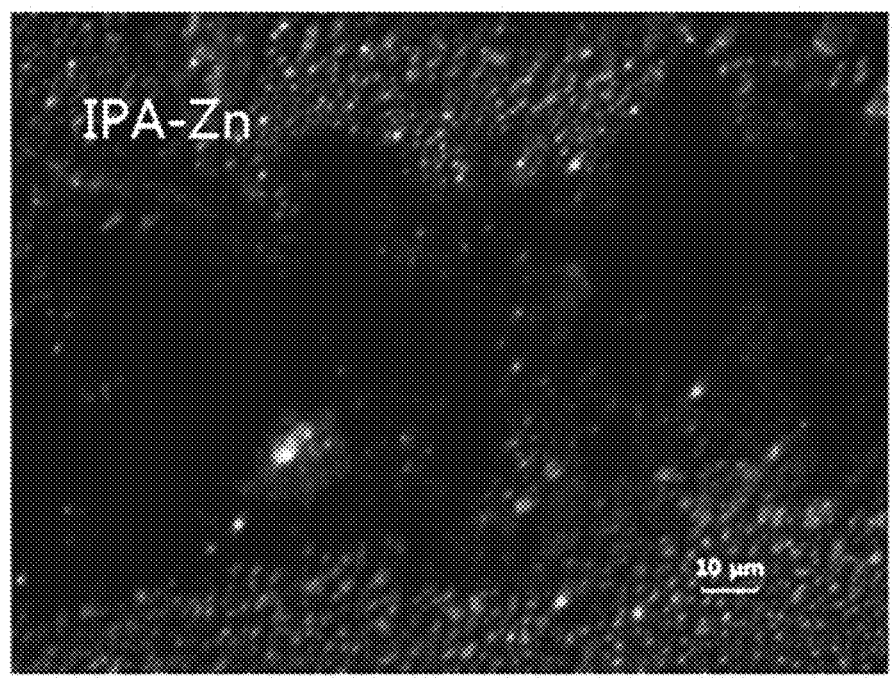
FIGS. 5A and 5B are images respectively showing the results of the Dark Field microscopic analysis (A) and the Fluorescent microscopic analysis (B) for the aggregate particle prepared in Example 1-1.
Figure 5B:
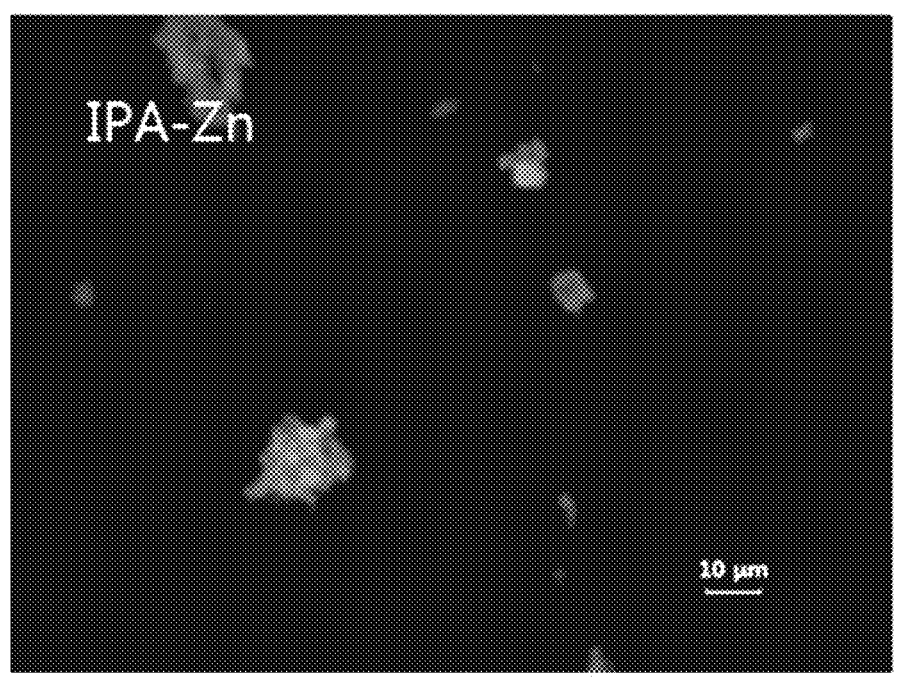
Figure 6A:
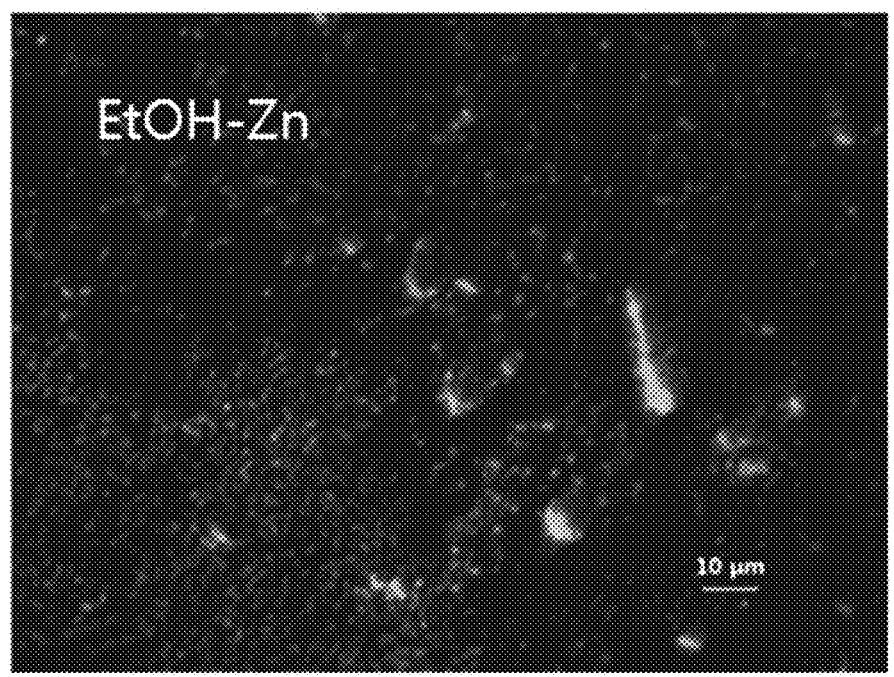
FIGS. 6A and 6B are images respectively showing the results of the Dark Field microscopic analysis (A) and the Fluorescent microscopic analysis (B) for the aggregate particle prepared in Example 1-2.
Figure 6B:
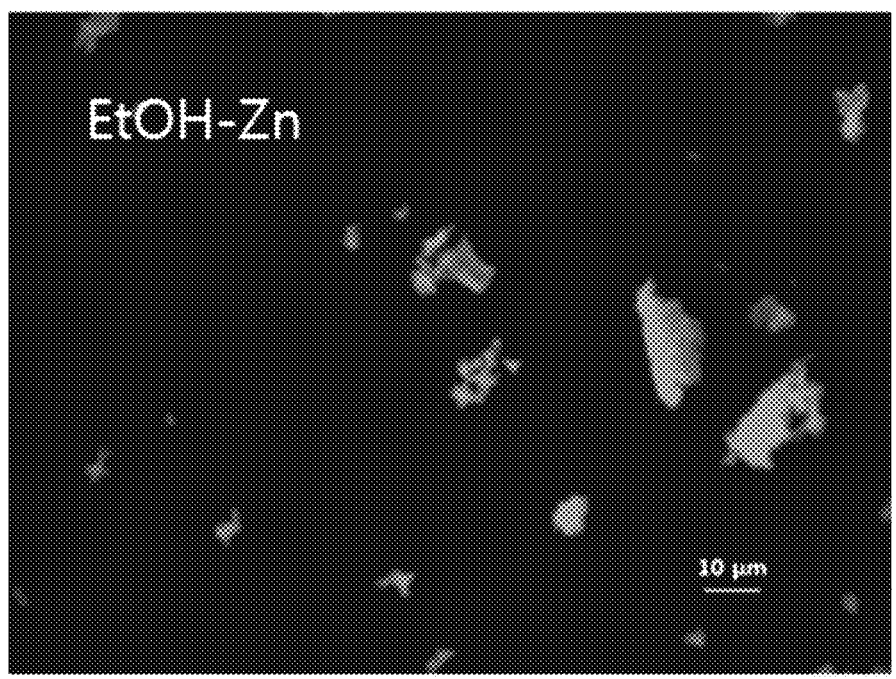
Figure 7A:
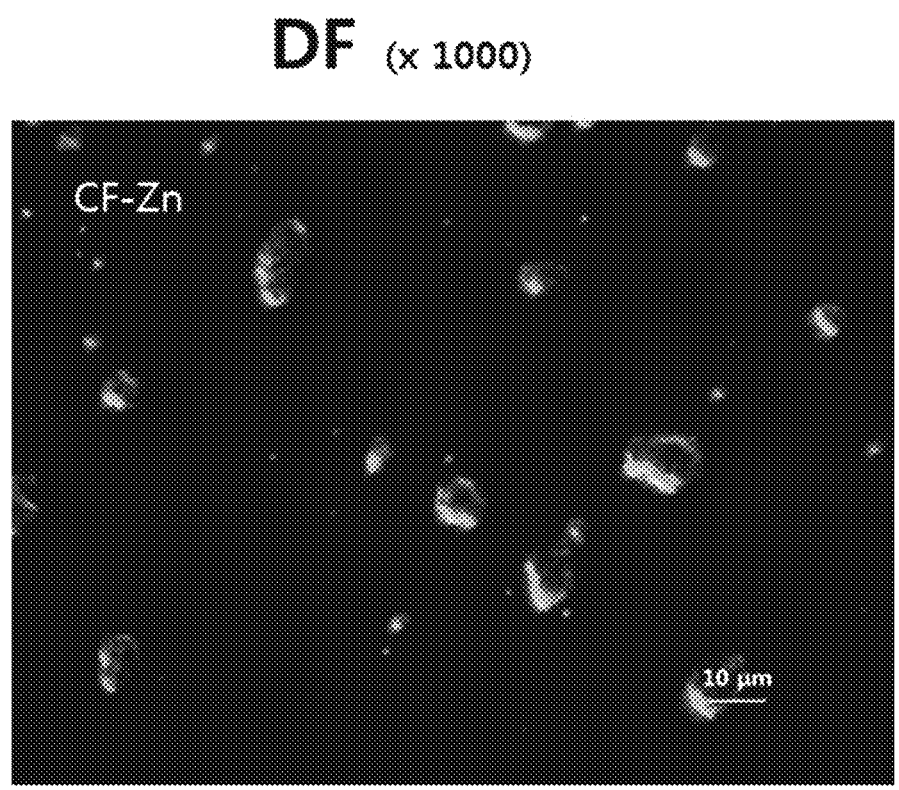
FIGS. 7A and 7B are images respectively showing the results of the Dark Field microscopic analysis (A) and the Fluorescent microscopic analysis (B) for the aggregate particle prepared in Example 1-3.
Figure 7B:
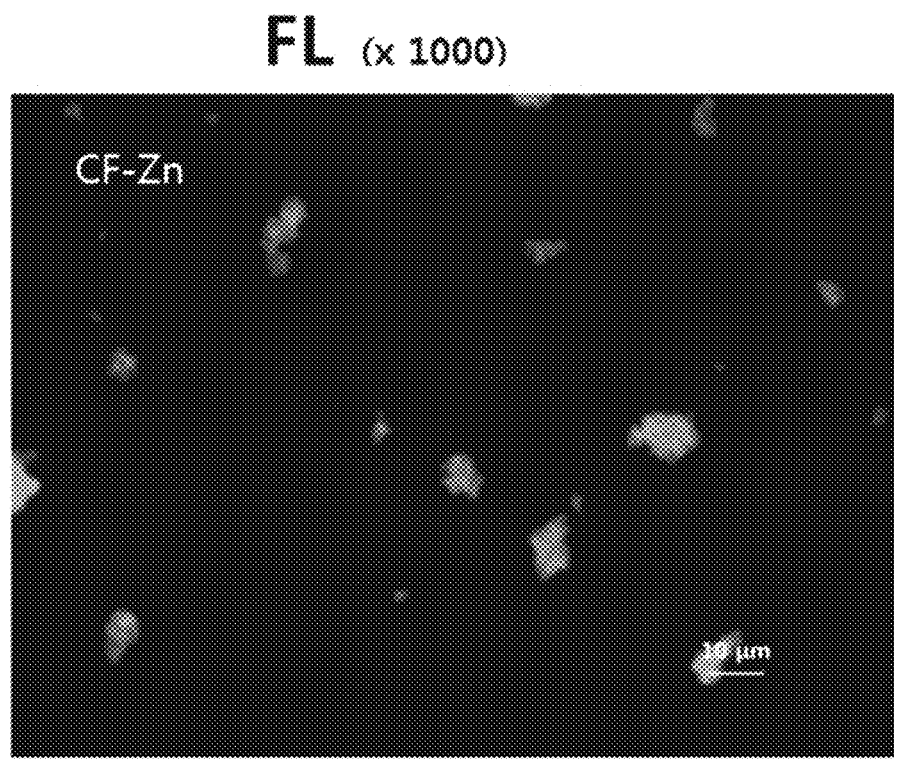
Figure 8A:
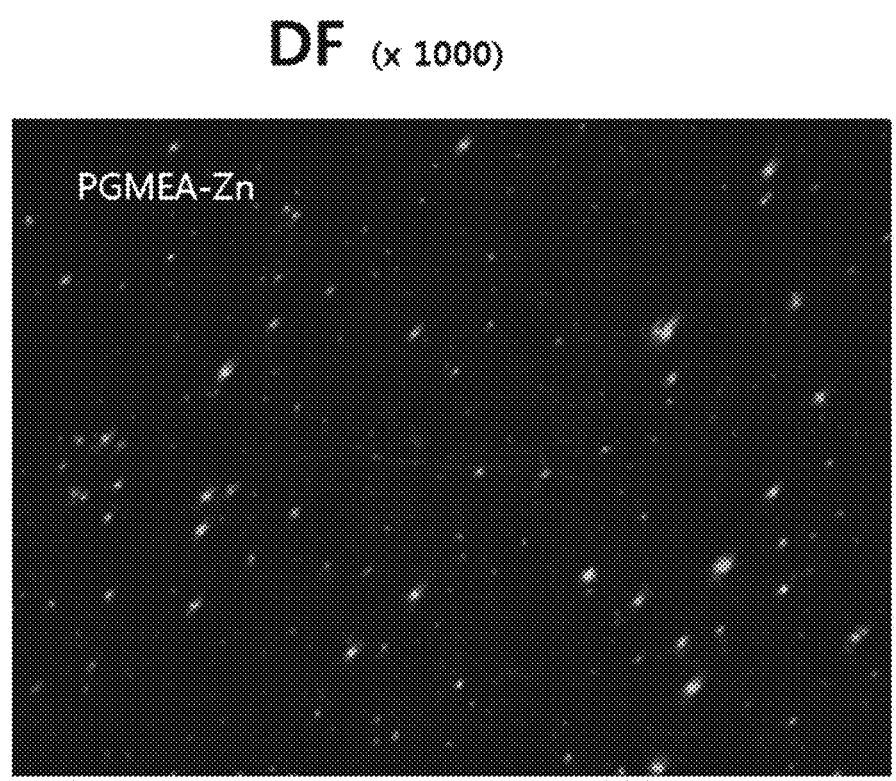
FIGS. 8A and 8B are images respectively showing the results of the Dark Field microscopic analysis (A) and the Fluorescent microscopic analysis (B) for the aggregate particle prepared in Example 1-4.
Figure 8B:
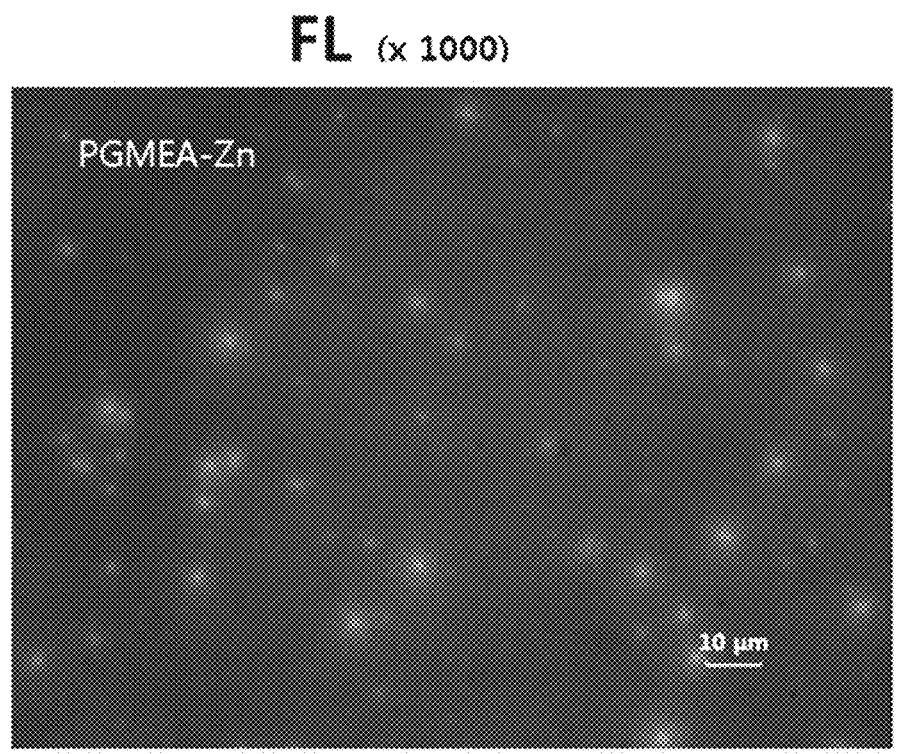

[4] For the aggregate particles obtained in Examples 1-1 to 1-4, a Dark Field microscopic analysis (A) and a Fluorescent microscopic analysis (B) are conducted and the results are shown in FIG. 5A and FIG. 5B (IPA-Zn), FIG. 6A and FIG. 6B (EtOH—Zn), FIG. 7A and FIG. 7B (CF—Zn), FIG. 8A and FIG. 8B (PGMEA-Zn). The results confirmed that the prepared particles include a quantum dot aggregate.

Example 2-1 to 2-3

Quantum dot aggregate particles are prepared in the same manner as Example 1-1 except that the zinc chloride is dissolved in the QD/PR composition instead of the organic solvent (i.e., iso-propyl alcohol), and the resulting mixture is added to iso-propyl alcohol (Example 2-1), ethanol (Example 2-2), PGMEA (Example 2-3) and then stirred. An average size of the quantum dot aggregate particles and a standard deviation thereof are measured, and the results are shown in Table 2.

TABLE 2

|  | Avg. particle size (nm) | Standard deviation (nm) |
|---|---|---|
| Example 2-1 (IPA) | 1140 | 310 |
| Example 2-2 (EtOH) | 4280 | 1080 |
| Example 2-3 (PGMEA) | 30 | 9 |

Figure 9:
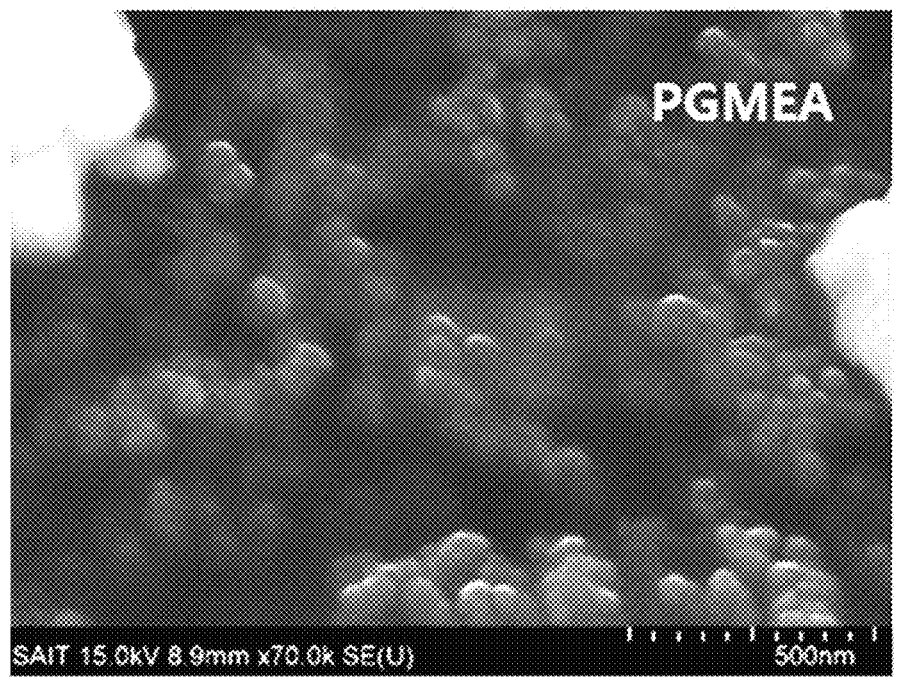
FIG. 9 is a scanning electron microscopic image of the quantum dot aggregate particle prepared in Example 2-3.

[3] The aggregate particles prepared in Example 2-3 are separated by centrifugation and their scanning electron microscopic image is shown in FIG. 9.

Figure 10A:
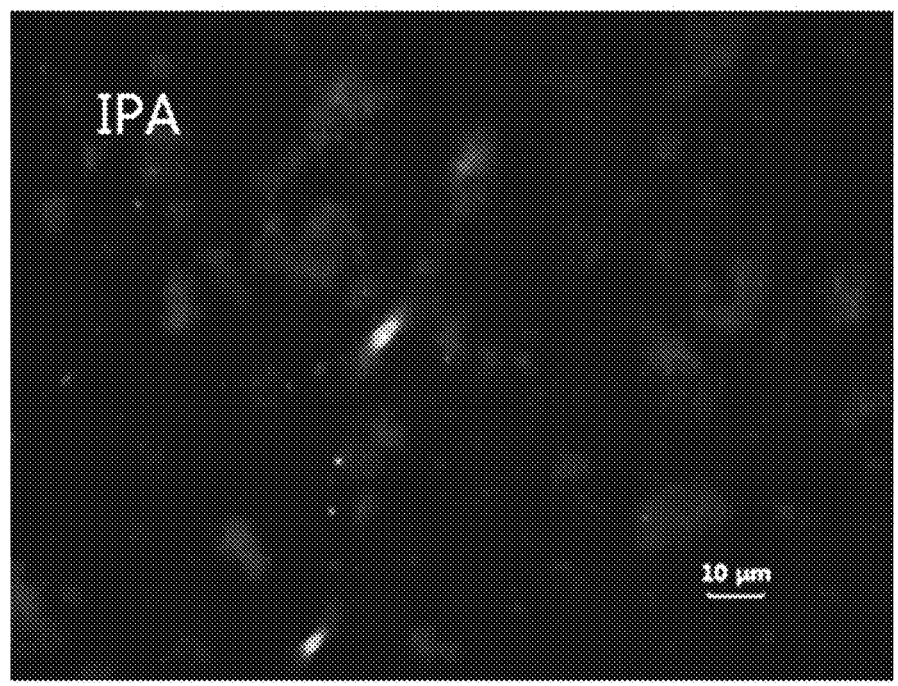
FIGS. 10A and 10B are images respectively showing the results of the Dark Field microscopic analysis (A) and the Fluorescent microscopic analysis (B) for the aggregate particle prepared in Example 2-1.
Figure 10B:
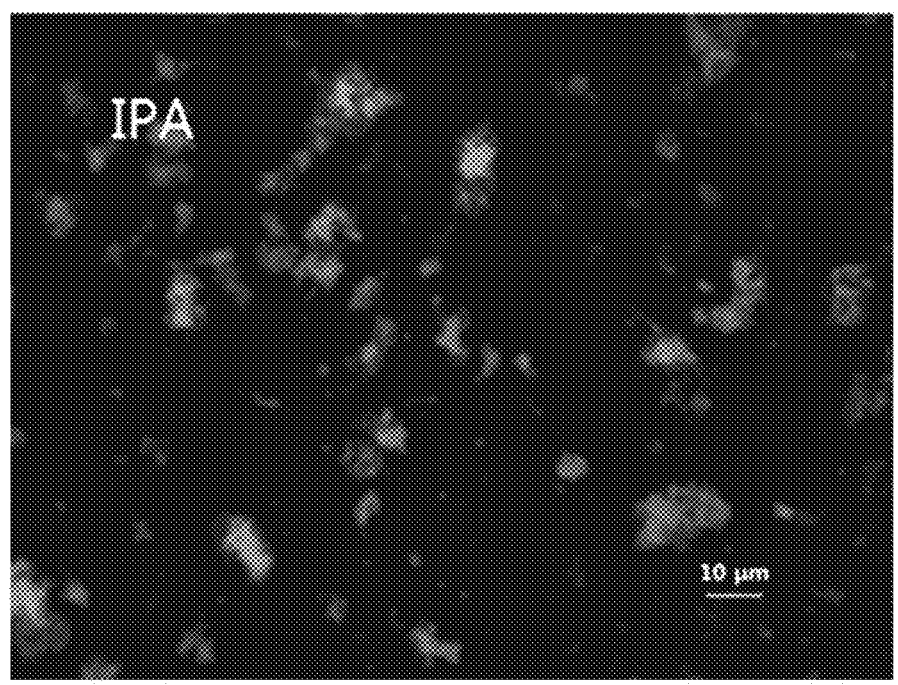
Figure 11A:
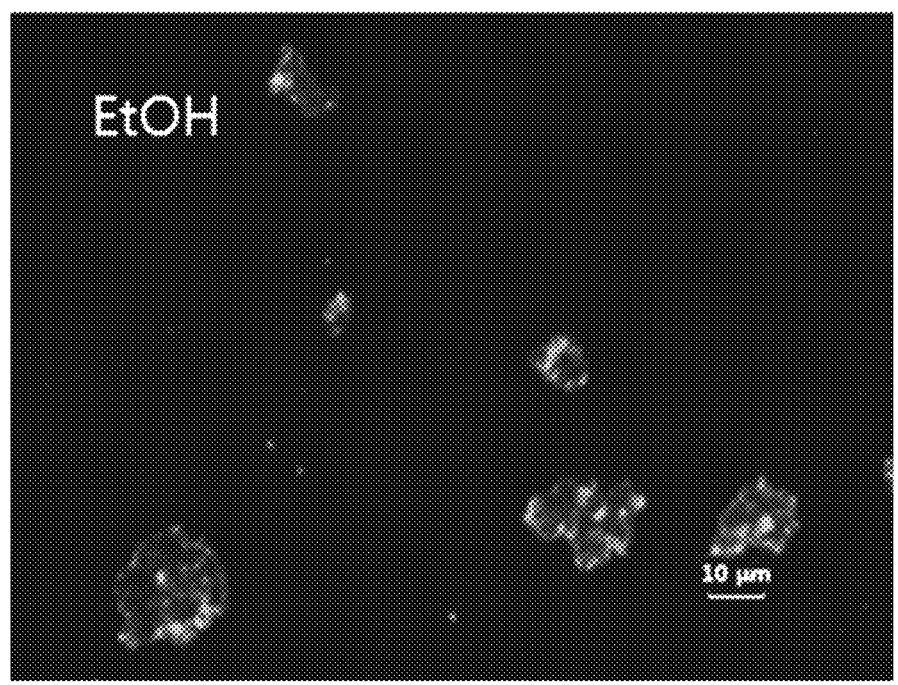
FIGS. 11A and 11B are images respectively showing the results of the Dark Field microscopic analysis (A) and the Fluorescent microscopic analysis (B) for the aggregate particle prepared in Example 2-2.
Figure 11B:
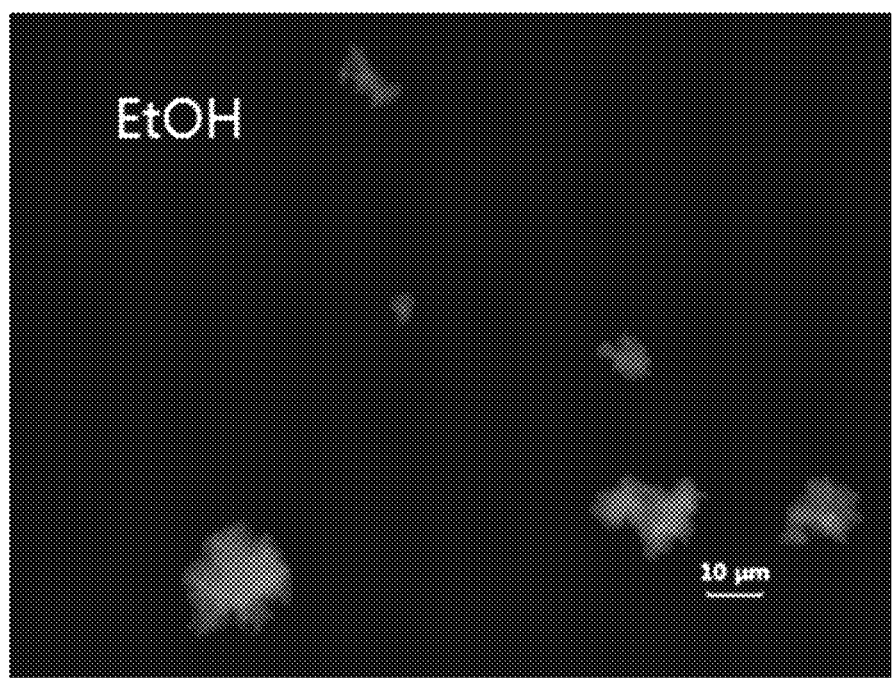
Figure 12A:
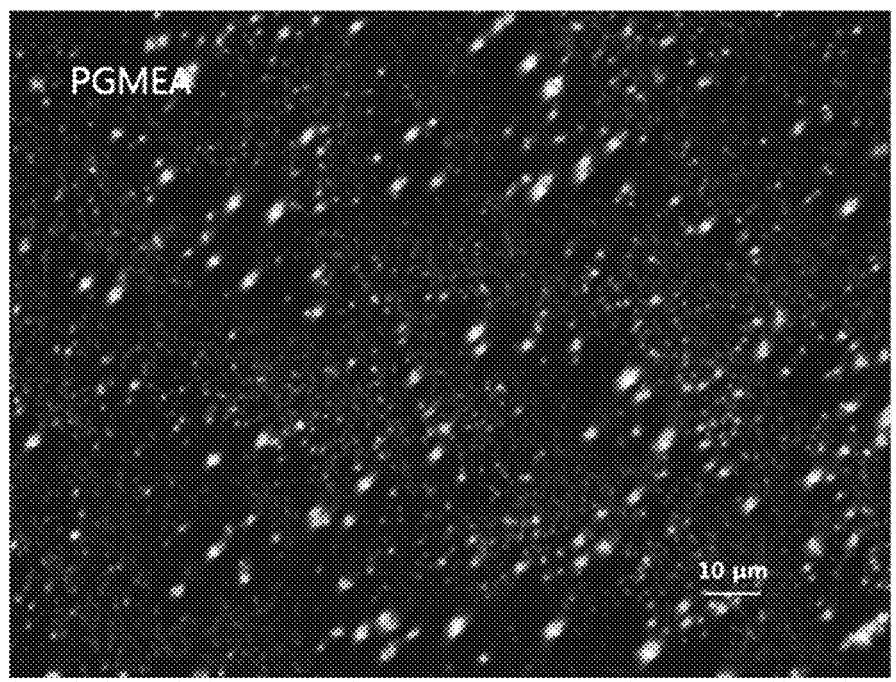
FIGS. 12A and 12B are images respectively showing the results of the Dark Field microscopic analysis (A) and the Fluorescent microscopic analysis (B) for the aggregate particle prepared in Example 2-3.
Figure 12B:
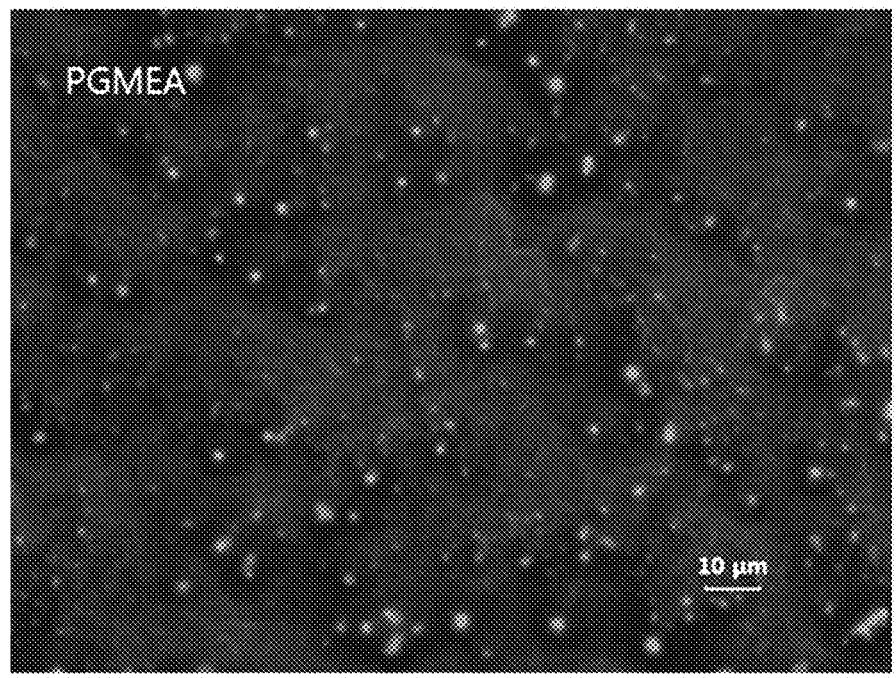

[4] For the aggregate particles obtained in Examples 2-1 to 2-3, a Dark Field microscopic analysis (A) and a Fluorescent microscopic analysis (B) are conducted and the results are shown in FIG. 10A and FIG. 10B (IPA), FIG. 11A and FIG. 11B (EtOH), FIG. 12A and FIG. 12B (PGMEA). The results confirmed that the prepared particles include a quantum dot aggregate.

Comparative Example 1-1 to 1-4

The same procedures are made as in Example 1-1 except that without using the zinc chloride, the QD/PR composition is added to iso-propyl alcohol (Comparative Example 1-1), ethanol (Comparative Example 1-2), chloroform (Comparative Example 1-3), or PGMEA (Comparative Example 1-4). It is confirmed that no precipitation occurs.

Preparation of Quantum Dot Aggregate II

According to the method illustrated in FIG. 1, a quantum dot aggregate particle is prepared without using a polymer.

Example 3-1 to 3-4, Example 4, and Example 5

Zinc chloride (Example 3-1 to 3-4, Example 4) or zinc acrylate (Example 5) is added to a chloroform dispersion of the quantum dots prepared in Reference Example to obtain a quantum dot metal compound solution. The quantum dot metal compound solution thus obtained and the 2T are added to chloroform (Example 3-1 to 3-3) or PGMEA (Example 4) to prepare a mixed solution having the composition set forth in Table 3. The mixed solution does not include the dispersant, e.g., SDS. The resulting mixed solution is stirred for 30 minutes to form a precipitate (quantum dot aggregate particles). The DLS technique is used to determine the size range of the quantum dot aggregate particles thus prepared, and the results are compiled in Table 3.

Comparative Example 2 to 5 and Comparative Example 6

The same procedure is carried out as Example 3-1 except that neither of the zinc chloride and the 2T or at least one of the zinc chloride and the 2T are added to the chloroform dispersion of the green light emitting quantum dots prepared in Reference Example 1. It is confirmed that no precipitation occurs.

The amount of the quantum dots in the mixed solution is changed into 38 wt % and the stirring is carried out in the same manner as Example 3-1. It is confirmed that gelation occurs.

TABLE 3

| | solvent | The amount of the quantum dot per solvent | Types and amounts of a Zn compound | The amount of 2T | Size of the aggregate particle |
|---|---|---|---|---|---|
| Comparative Example 2 (Ref. Ex) | chloroform | 0.5 wt % | — | — | NA |
| Comparative Example 3 (QD/CF) | chloroform | 20 wt % | — | — | NA |
| Comparative Example 4 (QD/Zn) | chloroform | 20 wt % | 7.5 wt % | — | NA |
| Comparative Example 5 (QD/2T) | chloroform | 20 wt % | — | 25 wt % | NA |
| Comparative Example 6 | chloroform | 38 wt % | 7.5 wt % | 25 wt % | gelation |
| Example 3-1 | chloroform | 0.5 wt % | 7.5 wt % | 25 wt % | 1-3 µm |
| Example 3-2 | chloroform | 0.5 wt % | 2.5 wt % | 25 wt % | 40-50 nm |
| Example 3-3 (QD/Zn(7.5)/2T) | chloroform | 20 wt % | 7.5 wt % | 25 wt % | 1-3 µm |
| Example 3-4 (QD/Zn(2.5)/2T) | chloroform | 20 wt % | 2.5 wt % | 25 wt % | 40-50 nm |
| Example 4 | PGMEA | 0.5 wt % | 7.5 wt % | 25 wt % | 10-500 µm (precipitation occurs immediately after the mixing) |
| Example 5 (QD/ZnAc(7.5)/2T) | chloroform | 20 wt % | 7.5 wt % | 25 wt % | 1-2 µm |

µm = micrometer

The results of Table 3 confirm that in the organic solvent such as chloroform or PGMEA, a proper amount of the quantum dots, the zinc chloride, and the 2T may form quantum dot aggregate particles having a relatively uniform size. In Comparative Examples 2 to 6, no aggregate particle is formed.

Stability Evaluation

Experimental Example 1

For each of the solutions of Comparative Example 3, Comparative Example 4, and Comparative Example 5 and the solutions including the quantum dot aggregate particles prepared in Examples 3-3 to 3-4 and Example 5, an absolute quantum yield is measured, and the results are compiled in Table 4.

Each of the solutions of Comparative Example 3, Comparative Example 4, and Comparative Example 5 and the solutions including the quantum dot aggregate particles prepared in Examples 3-3 to 3-4 and Example 5, is coated on a glass substrate and vacuum dried for 2 hours to prepare a film. For the prepared film, an absolute quantum yield is measured, and the results are compiled in Table 4.

The prepared film is heated at 180° C. for 30 minutes, and the absolute QY of the film is measured, and the results are compiled in Table 4.

TABLE 4

| | absolute QY (%) | | |
| --- | --- | --- | --- |
| | In solution | Film prior to heating | Film after heating |
| Comparative Example 3 (QD/CF) | 74.8 | 50 | 31.9 |
| Comparative Example 4 (QD/Zn) | 74.7 | 70.5 | 44.5 |
| Comparative Example 5 (QD/2T) | 76.5 | 62.7 | 35.4 |
| Example 3-3 (QD/Zn(7.5)/2T) | 75.8 | 63.4 | 58.2 |
| Example 3-4 (QD/Zn(2.5)/2T) | 74.9 | 64.8 | 45.9 |
| Example 5 (QD/ZnAc(7.5)/2T) | 79.3 | 66.5 | 61.3 |

The results of Table 4 confirm that the quantum dot aggregate particles of the Examples may have greatly increased luminous properties in comparison with the original luminous properties of the quantum dot themselves (i.e., those of Comparative Example 3). In addition, the quantum dot aggregate particles of the Examples may inhibit deterioration of luminous properties caused by the heat treatment in comparison with the quantum dot treated with the polyvalent metal compound or the thiol compound alone, showing enhanced heat stability.

Experimental Example 2

A solution including the quantum dots of Comparative Example 3, the quantum dot aggregate particles of Example 3-3, or the quantum dot aggregate particles of Example 3-4 are mixed with a solution of a binder polymer of a four membered copolymer of methacrylic acid, benzyl methacrylate, hydroxyethyl methacrylate, and styrene, (acid value: 130 milligrams (mg) per gram of KOH (mg KOH/g), molecular weight: 8,000 g/mol, acrylic acid:benzyl methacrylate:hydroxyethyl methacrylate:styrene (molar ratio)= 61.5%:12%:16.3%:10.2%) (in polypropylene glycol monomethyl ether acetate, a concentration of 30 percent by weight, wt %).

The absolute quantum yield of the solution is measured for each of the solution prior to and after the mixing, and the results are shown in Table 5.

TABLE 5

| | Absolute QY prior to the mixing (%) | Absolute QY after the mixing with the carboxylic acid group containing polymer (%) |
| --- | --- | --- |
| Comparative Example 3 | 74.8 | 54 |
| Example 3-3 (QD/Zn(7.5)/2T) | 75.8 | 71.5 |
| Example 3-4 (QD/Zn(2.5)/2T) | 74.9 | 70 |

The results of Table 5 confirm that the quantum dots of Comparative Example 3 has a greatly decreased absolute quantum yield after the mixing with the carboxylic acid group containing polymer. In contrast, in the case of the quantum dot aggregate particles, the decrease of the absolute quantum yield is inhibited (or reduced) after they are mixed with the polymer. Such results suggest that the quantum dot aggregate particles have improved chemical stability.

Experimental Example 3

The quantum dots of Comparative Example 3 and the quantum dot aggregate particles of Example 3-3 are separated by centrifugation, respectively. The separated particles are re-disperse in chloroform to form a 20% chloroform solution. A siloxane polymer (purchased from DOW-Corning, Co., Ltd., the product name: OE-7842) is mixed with each of the chloroform solution, and by annealing the resulting mixture at a temperature of 120° C. for 1.5 hours, a device shown in FIG. 2 is fabricated. The device is operated at a current of 100 milliamperes (mA), and the changes of the photoconversion efficiency over time is calculated with respect to the photoconversion efficiency before the device is operated to obtain a maintenance rate of the photoconversion efficiency. The results are shown in FIG. 13.

Figure 13:
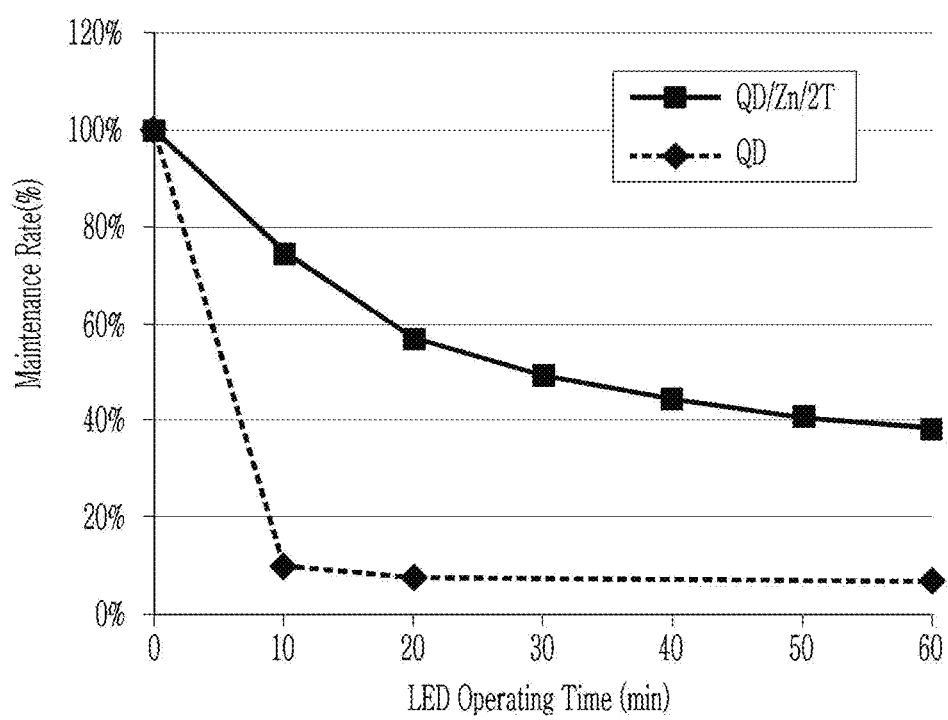
FIG. 13 is a graph of maintenance rate (percent, %) versus LED operating time (minutes, min) showing the results of Experimental Example 3.

The results of FIG. 13 confirm that the quantum dot aggregate particles of the Example may show greatly enhanced photo-stability in comparison with the quantum dots of Comparative Example 3.

While this disclosure has been described in connection with what is presently considered to be practical exemplary embodiments, it is to be understood that the present inventive concept is not limited to the disclosed embodiments, but, on the contrary, is intended to cover various modifications and equivalent arrangements included within the spirit and scope of the appended claims.

What is claimed is:

1. A quantum dot aggregate particle comprising:
 a plurality of quantum dots;
 a polyvalent metal compound; and
 a thiol compound comprising at least two thiol groups at its end terminals;
 wherein a size of the quantum dot aggregate particle is in a range from about 20 nanometers to about 10 micrometers.

2. The quantum dot aggregate particle of claim 1, wherein at least two quantum dots of the plurality of quantum dots are linked to each other by the polyvalent metal compound, the thiol compound, or a combination thereof.

3. The quantum dot aggregate particle of claim 1, wherein the quantum dot comprises a Group II-VI compound, a Group III-V compound, a Group IV-VI compound, a Group IV element or compound, a Group I-III-VI compound, a Group I-II-IV-VI compound, or a combination thereof.

4. The quantum dot aggregate particle of claim 1, wherein the polyvalent metal compound comprises Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof.

5. The quantum dot aggregate particle of claim 1, wherein the polyvalent metal compound comprises an organometallic compound, an organic salt, an inorganic salt, or a combination thereof.

6. The quantum dot aggregate particle of claim 1, wherein the polyvalent metal compound is represented by Chemical Formula 1:

$$MA_n \qquad \text{Chemical Formula 1}$$

wherein M is Mg, Ca, Sc, Ti, V, Cr, Mn, Fe, Co, Ni, Cu, Zn, Ga, Sr, Y, Zr, Nb, Mo, Cd, In, Ba, Au, Hg, or Tl, n is an integer of greater than or equal to 2 and is determined depending on the valency of the M, A is each independently a halogen, an organic group comprising a carbon number of less than or equal to 25, or a combination thereof.

7. The quantum dot aggregate particle of claim 1, wherein the polyvalent metal compound comprises a metal chloride, an alkylated metal, a metal acetate, a metal (meth)acrylate, a metal dialkyldithiocarbamate, or a combination thereof.

8. The quantum dot aggregate particle of claim 1, wherein the polyvalent metal compound comprises zinc chloride, zinc (meth)acrylate, zinc acetate, a zinc dialkyldithiocarbamate, diethyl zinc, indium chloride, indium (meth)acrylate, indium acetate, or a combination thereof.

9. The quantum dot aggregate particle of claim 1, wherein the thiol compound comprises a compound represented by Chemical Formula 2:

$$[R^1\!\!-\!\!]_{k1}\!\!-\!\!L_1\!\!-\!\!(Y_1\!\!-\!\!(SH)_m)_{k2} \qquad \text{Chemical Formula 2}$$

wherein, $R^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, —NH$_2$, a substituted or unsubstituted C1 to C30 amine group (—NRR', wherein R and R' are independently hydrogen or a C1 to C30 linear or branched alkyl group provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' wherein R and R' are independently hydrogen or a C1 to C20 linear or branched alkyl group, —C(=O)ONRR' (wherein R and R' are independently hydrogen or a C1 to C20 linear or branched alkyl group) or a combination thereof, L$_1$ is a carbon atom, a substituted or unsubstituted C1 to C30 alkylene group, a substituted or unsubstituted C2 to C30 alkylene group wherein at least one methylene (—CH$_2$—) is replaced with sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, Y$_1$ is a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of Y$_1$ when Y$_1$ is not a single bond, and provided that the sum of k1 and k2 does not exceed the valence of L$_1$.

10. The quantum dot aggregate particle of claim 9, wherein the thiol compound comprises a compound represented by Chemical Formula 2-1:

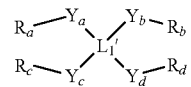

Chemical Formula 2-1 wherein

L$_{1'}$ is carbon, a substituted or unsubstituted C2 to C20 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, each of Y$_a$ to Y$_d$ is independently a single bond, a substituted or unsubstituted C1 to C30 alkylene group, a substituted or unsubstituted C2 to C30 alkenylene group, or a C2 to C30 alkylene group or a C3 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of $R_a$ to $R_d$ is $R^1$ of Chemical Formula 2 or SH, provided that at least two of $R_a$ to $R_d$ are SH.

11. The quantum dot aggregate particle of claim 1, wherein the thiol compound comprises ethoxylated pentaerythritol tetra(3-mercaptopropionate), trimethylolpropane tris(3-mercaptopropionate), trimethylolpropane-tri(3-mercaptoacetate), glycol di-3-mercaptopropionate, polypropylene glycol di(3-mercaptopropionate), ethoxylated trimethylolpropane tri(3-mercaptopropionate), glycol dimercaptoacetate, ethoxylated glycol dimercaptoacetate, 1,4-bis(3-mercaptobutyryloxy)butane, tris[2-(3-mercaptopropionyloxy)ethyl]isocyanurate, 1,3,5-tris(3-mercaptobutyloxyethyl)-1,3,5-triazine-2,4,6(1H,3H,5H)-trione, pentaerythritol tetrakis(3-mercaptopropionate), pentaerythritol tetrakis(2-mercaptoacetate), 1,6-hexanedithiol, 1,3-propanedithiol, 1,2-ethanedithiol, a polyethylene glycol dithiol comprising 1 to 10 ethylene glycol repeating units, or a combination thereof.

12. The quantum dot aggregate particle of claim 1, wherein the quantum dot aggregate particle has a size of less than or equal to about 200 nanometers.

13. The quantum dot aggregate particle of claim 1, wherein the quantum dot aggregate particle comprises a carboxylic acid group containing polymer, a polymerization product of a polymerizable monomer comprising at least one carbon-carbon double bonds, or a combination thereof.

14. The quantum dot aggregate particle of claim 1, wherein the carboxylic acid group containing polymer comprises
a copolymer of a monomer combination comprising a first monomer comprising a carboxylic acid group and a carbon-carbon double bond, a second monomer comprising a carbon-carbon double bond and a hydrophobic moiety and not comprising a carboxylic acid group, and optionally, a third monomer comprising a carbon-carbon double bond and a hydrophilic moiety and not comprising a carboxylic acid group;
a multiple aromatic ring-containing polymer comprising a backbone structure in a main chain and comprising a carboxylic acid group (—COOH), wherein the backbone structure comprises a quaternary carbon atom, which is a part of a cyclic group, and two aromatic rings bound to the quaternary carbon atom; or
a combination thereof.

15. The quantum dot aggregate particle of claim 13, wherein the carboxylic acid group containing polymer has an acid value of greater than or equal to about 50 milligrams of KOH per gram of the polymer and less than or equal to about 250 milligrams of KOH per gram of the polymer.

16. A method of producing a quantum dot aggregate particle of claim 1, comprising:
mixing a plurality of quantum dots with a polyvalent metal compound and a thiol compound in an organic solvent to obtain a mixed solution,
wherein the amount of the plurality of quantum dots, the amount of the polyvalent metal compound, and the amount of the thiol compound are controlled depending on a type of the organic solvent to form a quantum dot aggregate particle.

17. The method of claim 16, further comprising stirring a mixture of the plurality of quantum dots, the polyvalent metal compound, the thiol compound and the organic solvent.

18. The method of claim 16, further comprising adding a carboxylic acid group containing polymer, a mixture of a polymerizable monomer comprising at least one carbon-carbon double bond and a photoinitiator, or a combination thereof to the organic solvent.

19. The method of claim 18, further comprising irradiating the mixed solution with UV rays.

20. The method of claim 16, wherein the organic solvent comprises a C1 to C10 halogenated hydrocarbon, a C1 to C10 alcohol, a C1 to C15 glycol ether solvent, a glycol ether acetate solvent or a combination thereof.

21. A composition comprising:
a quantum dot aggregate particle of claim 1,
a carboxylic acid group containing polymer,
a polymerizable monomer comprising a carbon-carbon double bond,
a photoinitiator, and
a solvent.

22. The composition of claim 21, wherein the polymerizable monomer comprises alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxyacrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof.

23. The composition of claim 21, wherein the composition comprises:
about 0.01 weight percent to about 60 weight percent of the quantum dot aggregate particles;
about 0.005 weight percent to about 60 weight percent of the carboxylic acid group containing polymer;
about 0.005 weight percent to about 70 weight percent of the polymerizable monomer;
about 0.0001 weight percent to about 10 weight percent of the photoinitiator; and
a balance amount of the solvent,
based on the total weight of the composition.

24. A composite comprising:
a polymer matrix; and
a quantum dot aggregate particle of claim 1, dispersed in the polymer matrix.

25. The composite of claim 24, wherein the polymer matrix comprises a thiolene polymer, a (meth)acrylate polymer, a urethane polymer, an epoxy polymer, a vinyl polymer, a silicone polymer, or a combination thereof.

26. An electronic device comprising a quantum dot aggregate particle of claim 1.

* * * * *